(12) United States Patent
Nozoe

(10) Patent No.: US 12,489,418 B2
(45) Date of Patent: Dec. 2, 2025

(54) ELASTIC WAVE ELEMENT AND COMMUNICATION DEVICE

(71) Applicant: KYOCERA Corporation, Kyoto (JP)

(72) Inventor: Soichiro Nozoe, Soraku-gun (JP)

(73) Assignee: KYOCERA CORPORATION, Kyoto (JP)

(*) Notice: Subject to any disclaimer, the term of this patent is extended or adjusted under 35 U.S.C. 154(b) by 464 days.

(21) Appl. No.: 18/023,535

(22) PCT Filed: Aug. 27, 2021

(86) PCT No.: PCT/JP2021/031584
§ 371 (c)(1),
(2) Date: Feb. 27, 2023

(87) PCT Pub. No.: WO2022/045307
PCT Pub. Date: Mar. 3, 2022

(65) Prior Publication Data
US 2024/0030891 A1 Jan. 25, 2024

(30) Foreign Application Priority Data

Aug. 28, 2020 (JP) ................................ 2020-144341

(51) Int. Cl.
H03H 9/145 (2006.01)
H03H 9/02 (2006.01)
(Continued)

(52) U.S. Cl.
CPC .... *H03H 9/14544* (2013.01); *H03H 9/02992* (2013.01); *H03H 9/25* (2013.01); *H03H 9/6483* (2013.01)

(58) Field of Classification Search
None
See application file for complete search history.

(56) References Cited

U.S. PATENT DOCUMENTS

2014/0368401 A1* 12/2014 Miyake .................. H03H 9/725
343/858
2015/0070227 A1* 3/2015 Kishino ............... H03H 9/0576
333/133

(Continued)

FOREIGN PATENT DOCUMENTS

| JP | 2012-257019 A | 12/2012 |
| WO | 2018/003338 A1 | 1/2018 |
| WO | 2020/100949 A1 | 5/2020 |

*Primary Examiner* — Wilson Lee
(74) *Attorney, Agent, or Firm* — Volpe Koenig

(57) ABSTRACT

A cavity overlapping an IDT electrode in a see-through plan view is formed between a piezoelectric layer and a support. An intersection region where first electrode fingers and second electrode fingers overlap each other includes a central region and two end regions located on both sides of the central region in one-to-one correspondence. The cavity overlaps the central region. An edge of the cavity on a side closer to the first busbar is located within a range from an edge of the central region on a side closer to the first busbar to an edge of the first busbar on a side opposite to the central region. The first electrode fingers extending from the first busbar each include a first portion located in the central region and a second portion located on a side closer to the first busbar or a side closer to the second busbar relative to the central region. A value of mass per unit length of the first electrode fingers above lower surfaces thereof is greater in the second portions than in the first portions.

11 Claims, 33 Drawing Sheets

(51) Int. Cl.
*H03H 9/25* (2006.01)
*H03H 9/64* (2006.01)

(56) References Cited

U.S. PATENT DOCUMENTS

| | | | | |
|---|---|---|---|---|
| 2015/0214923 A1* | 7/2015 | Tsuzuki | ............... | H03H 9/605 333/186 |
| 2016/0049920 A1* | 2/2016 | Kishino | ............... | H03H 9/725 343/858 |
| 2016/0380357 A1* | 12/2016 | Keller | ............... | G01R 33/093 216/13 |
| 2019/0131954 A1 | 5/2019 | Okada | | |
| 2022/0014172 A1 | 1/2022 | Nozoe | | |

* cited by examiner

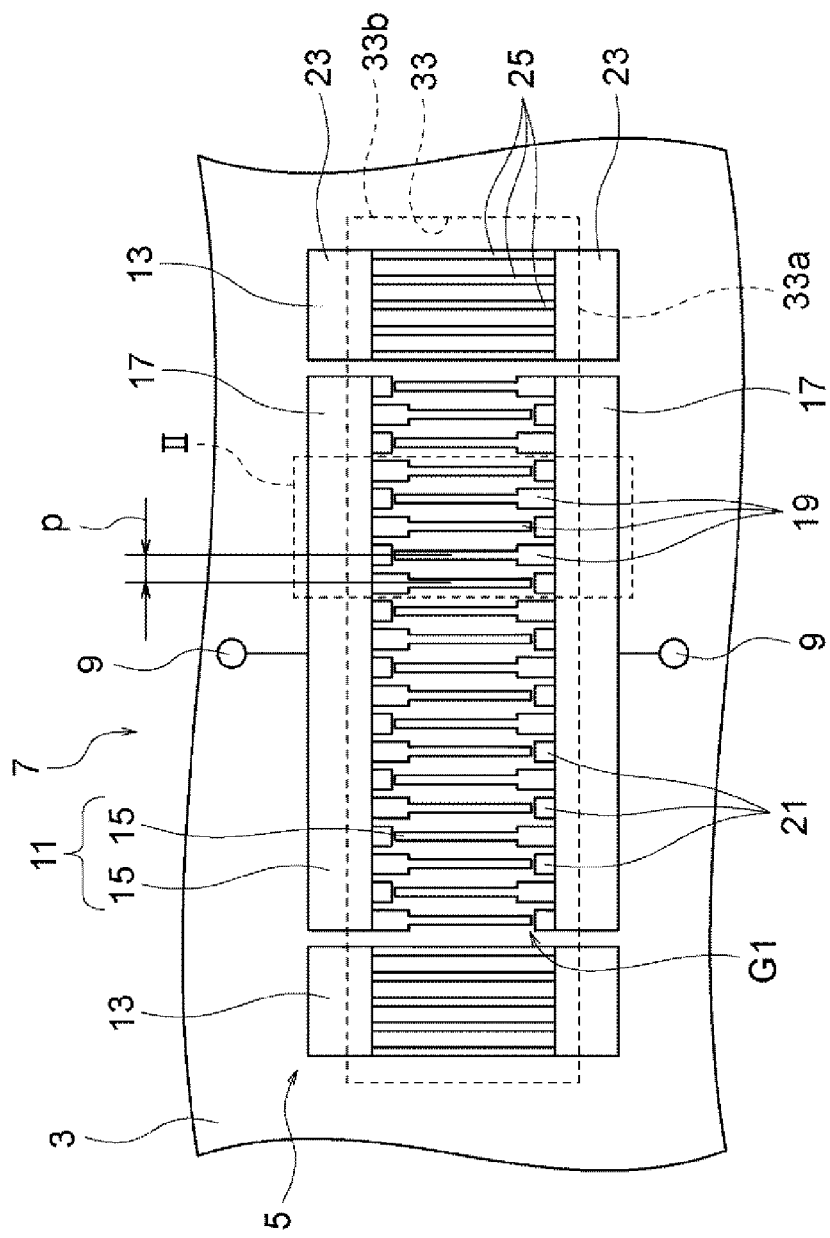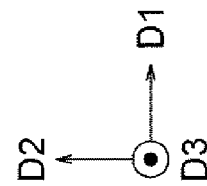

FIG. 2
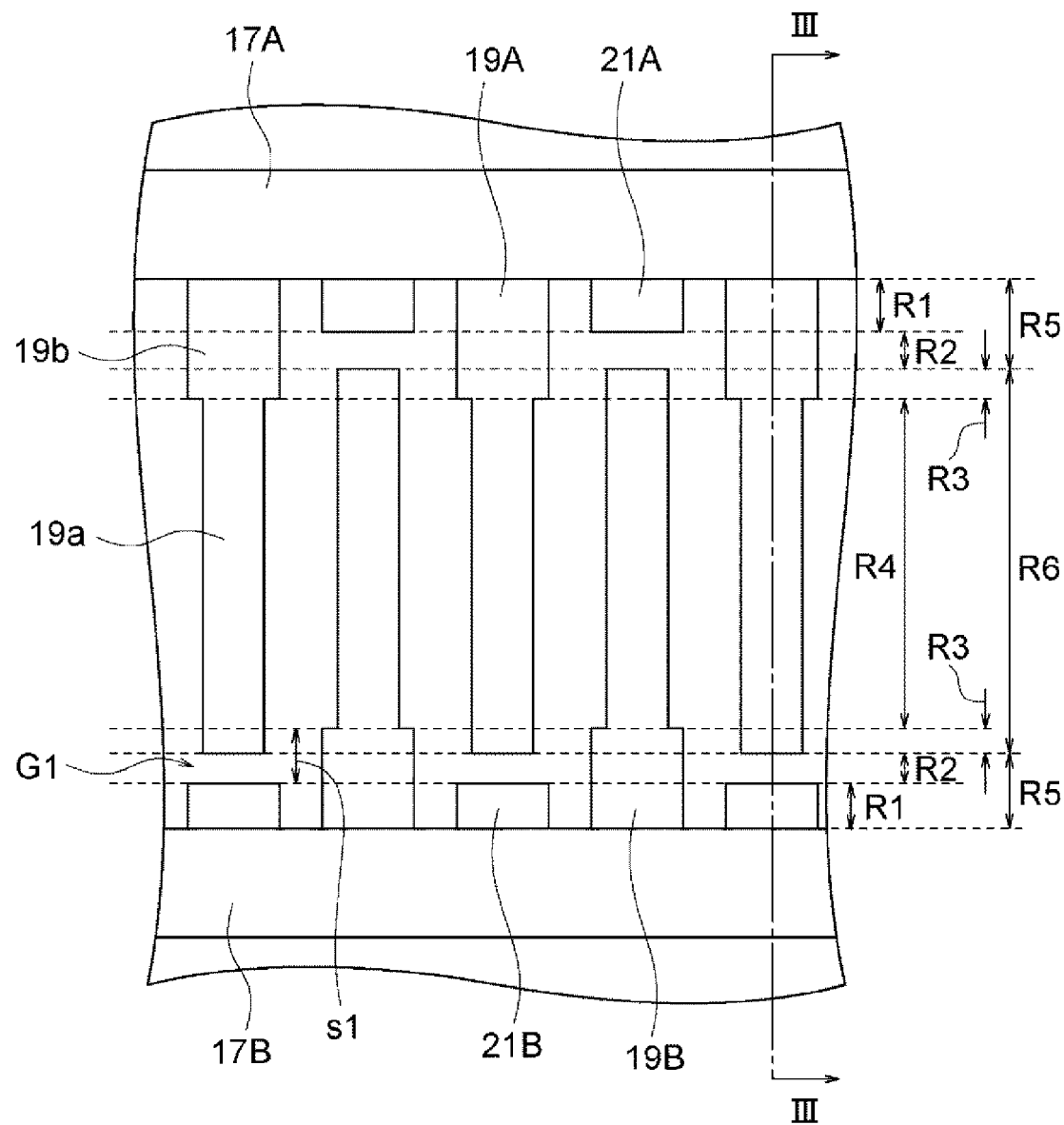
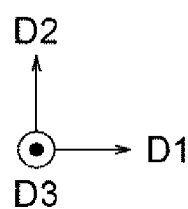

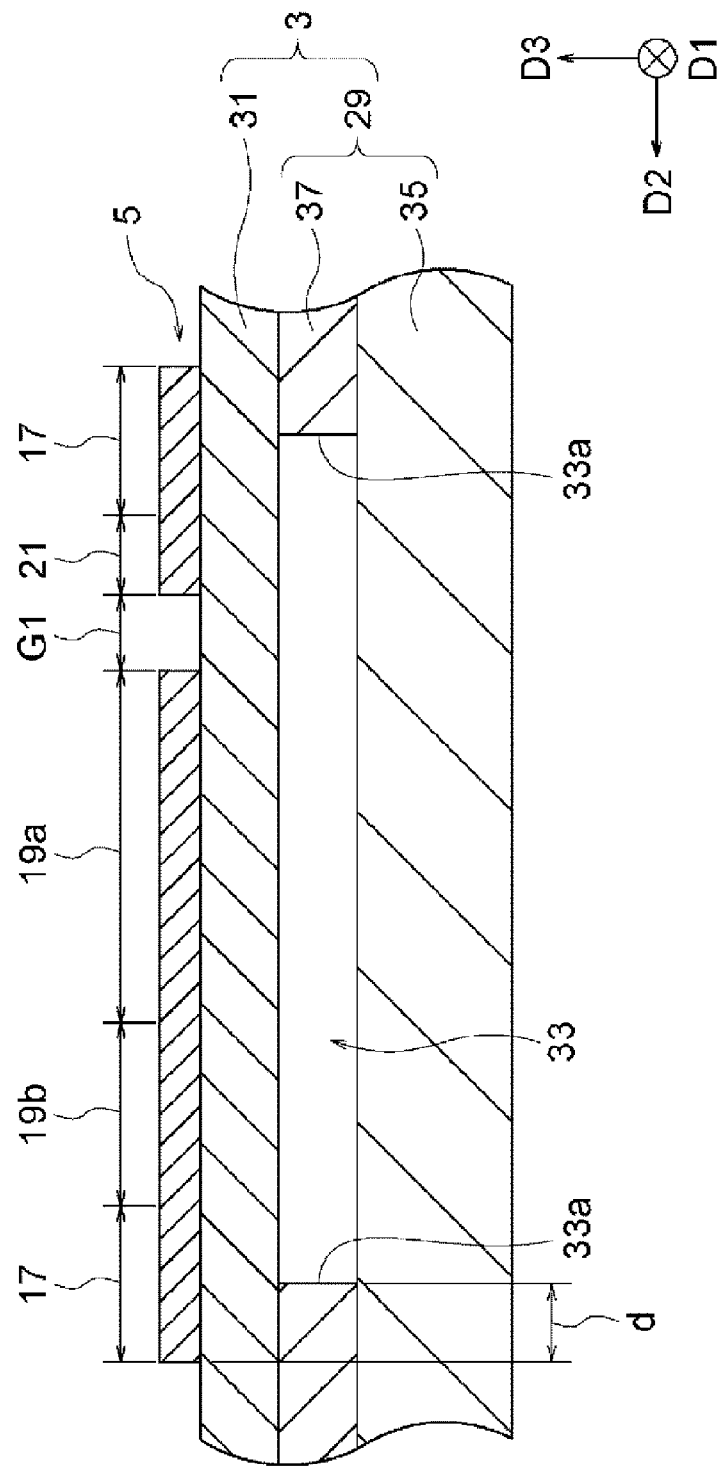

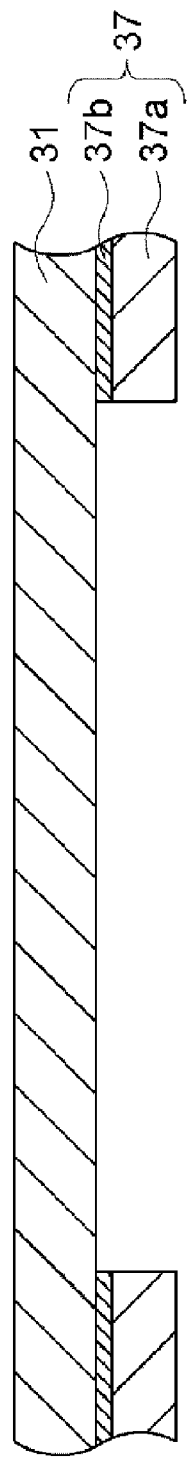

FIG. 5A
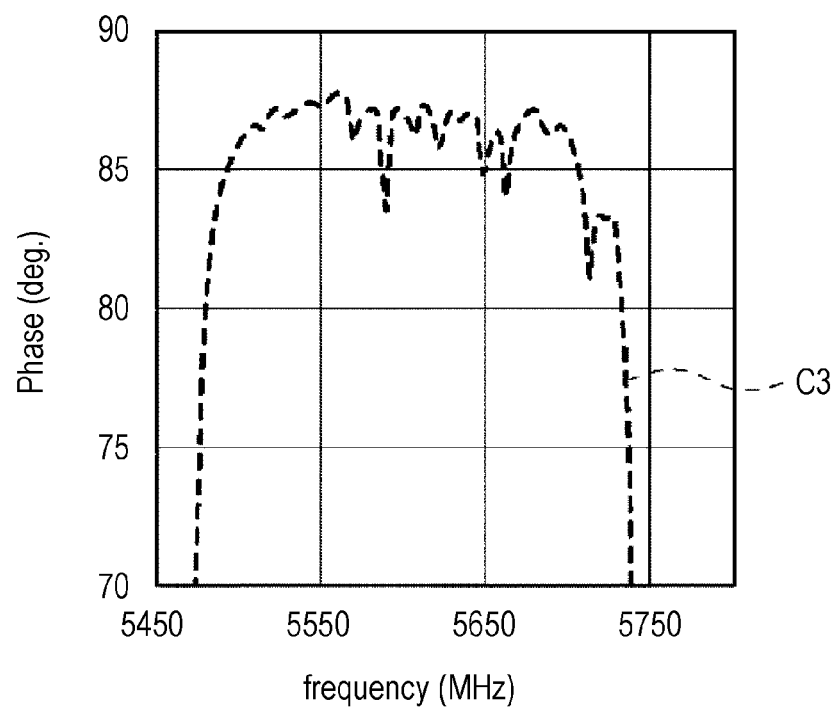
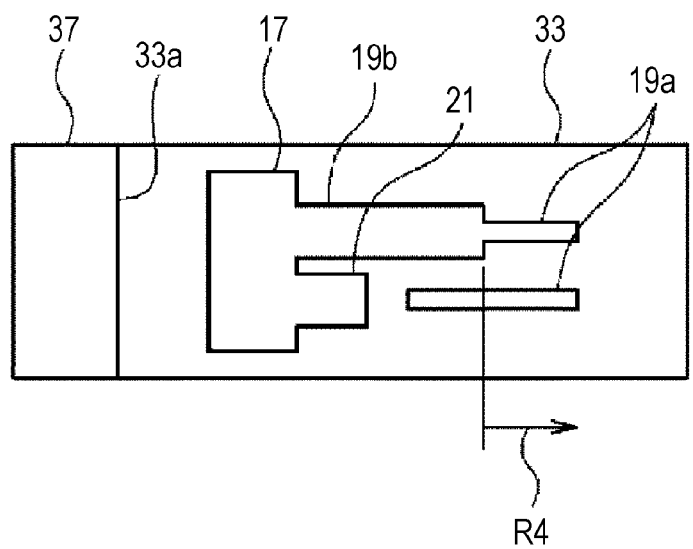

FIG. 5B
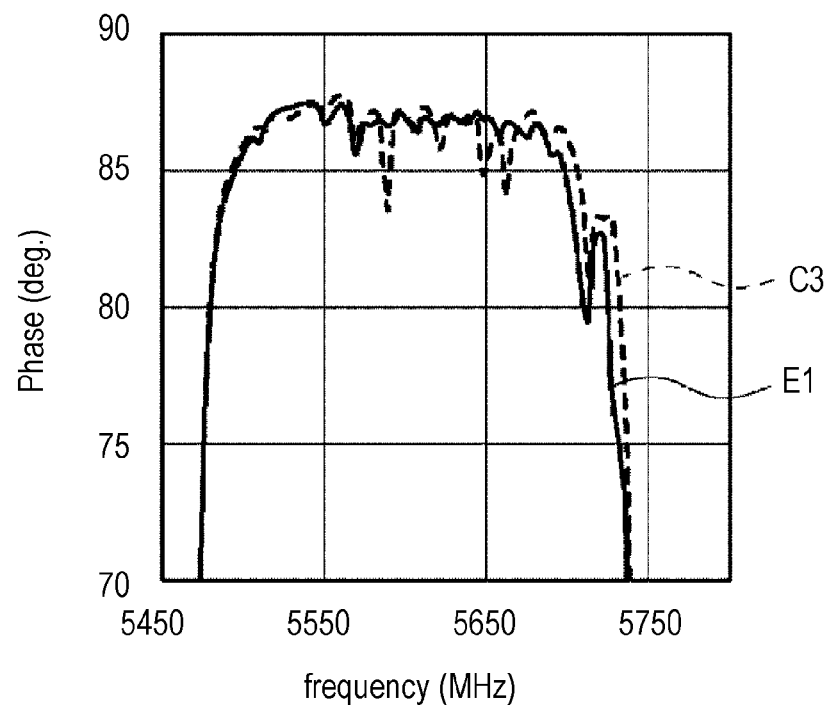
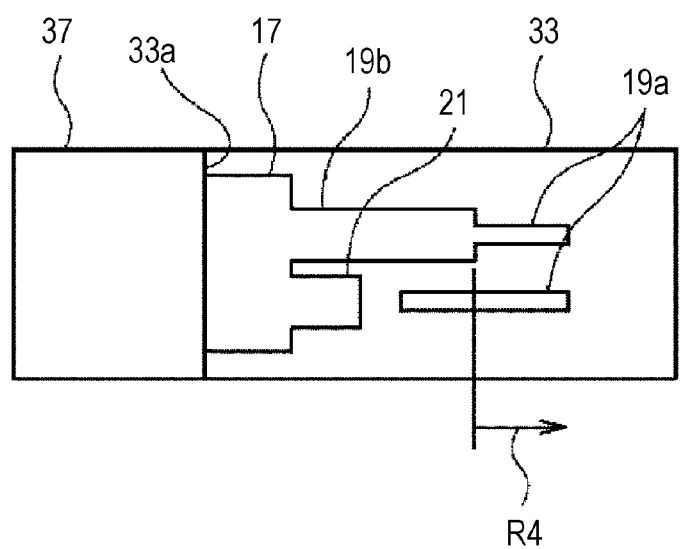

FIG. 5C
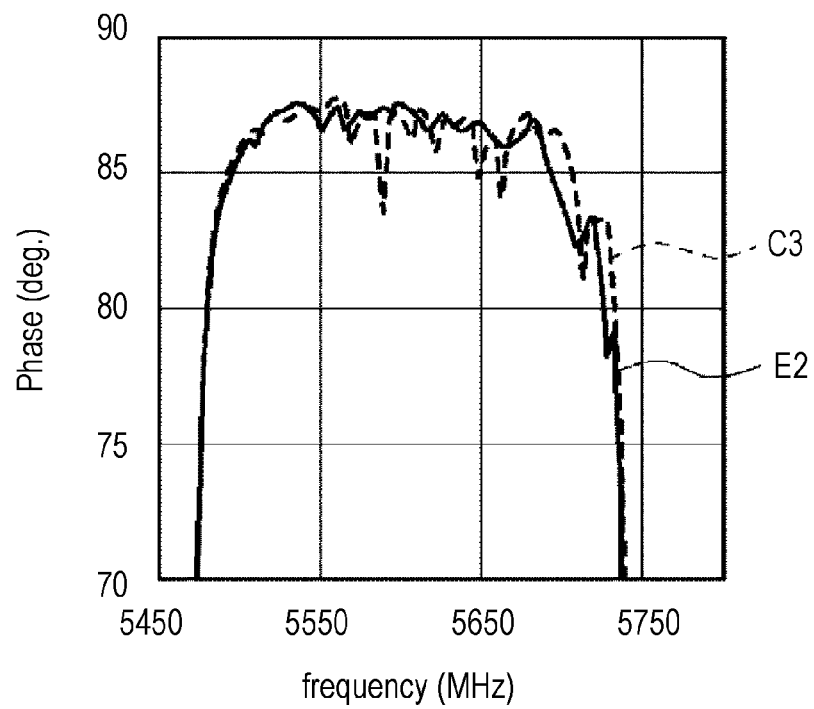
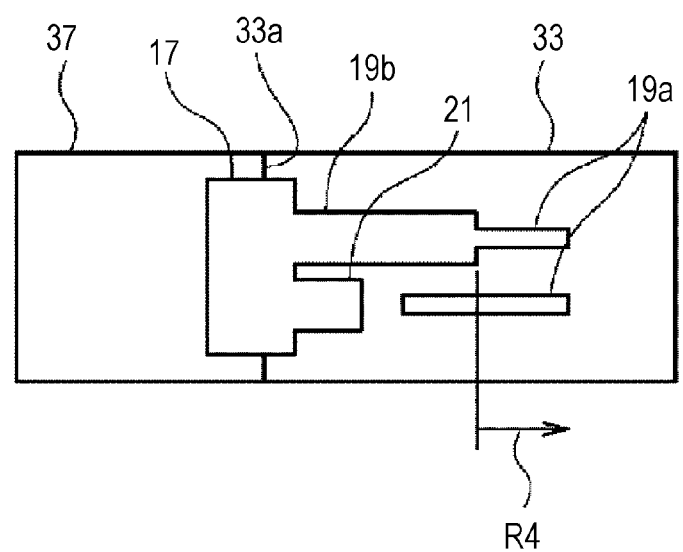

FIG. 6A
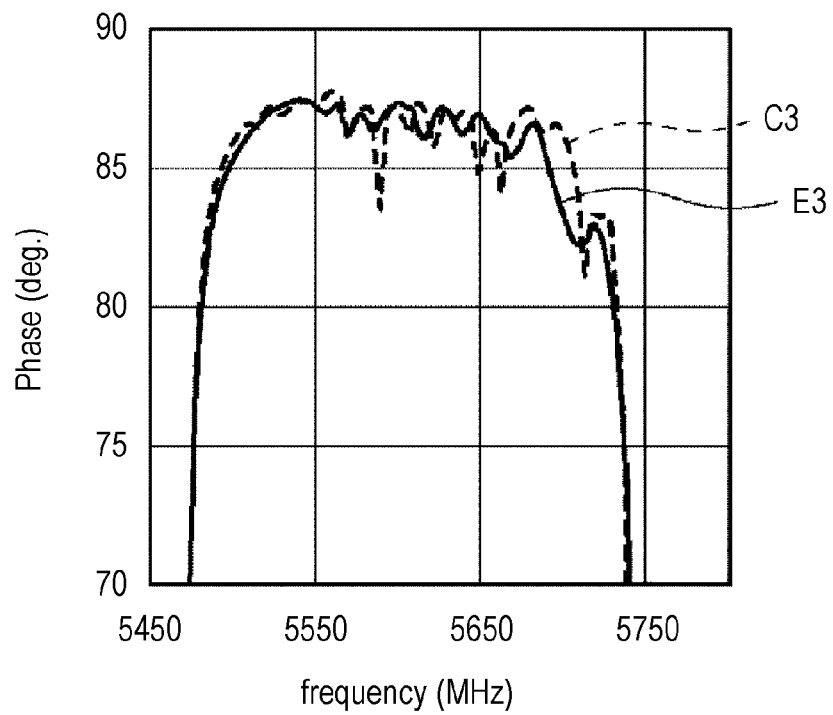
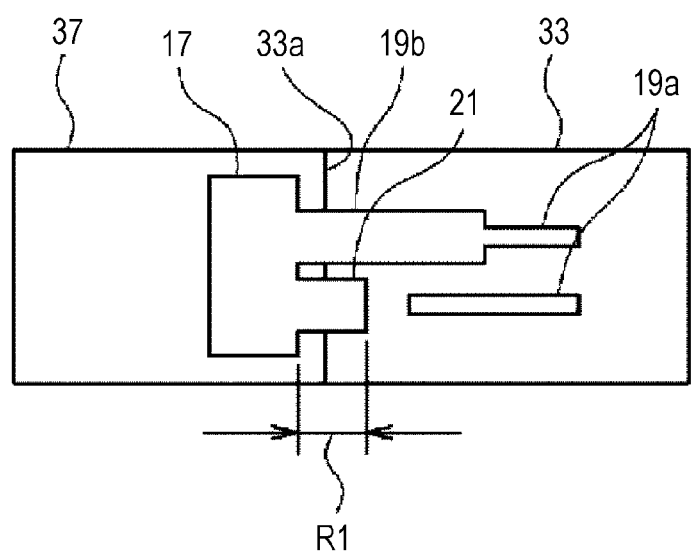

FIG. 6B
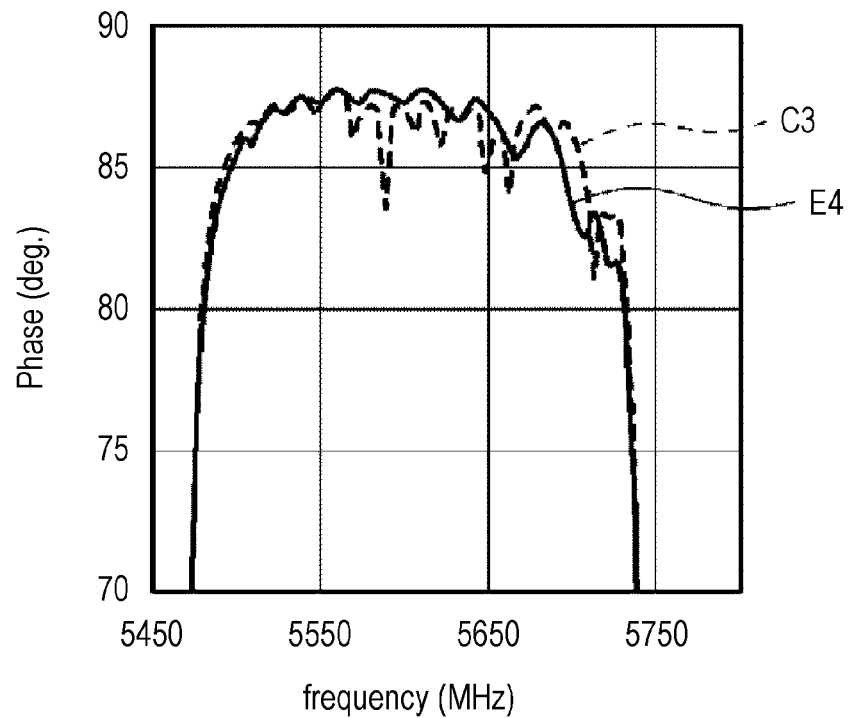
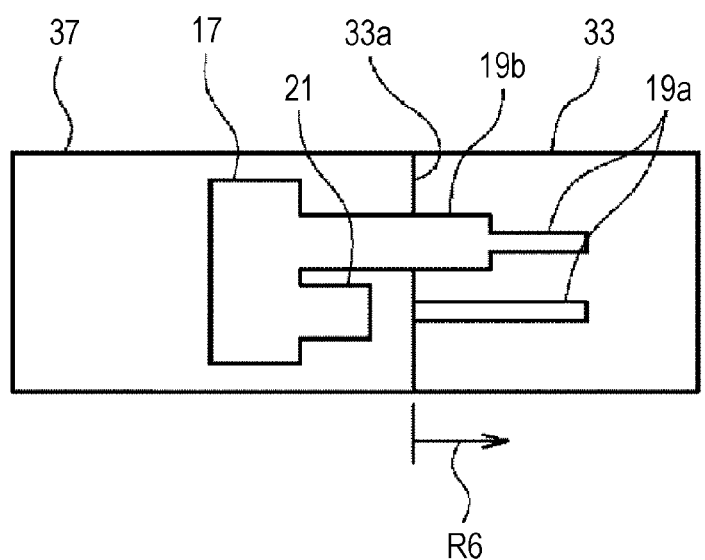

FIG. 6C
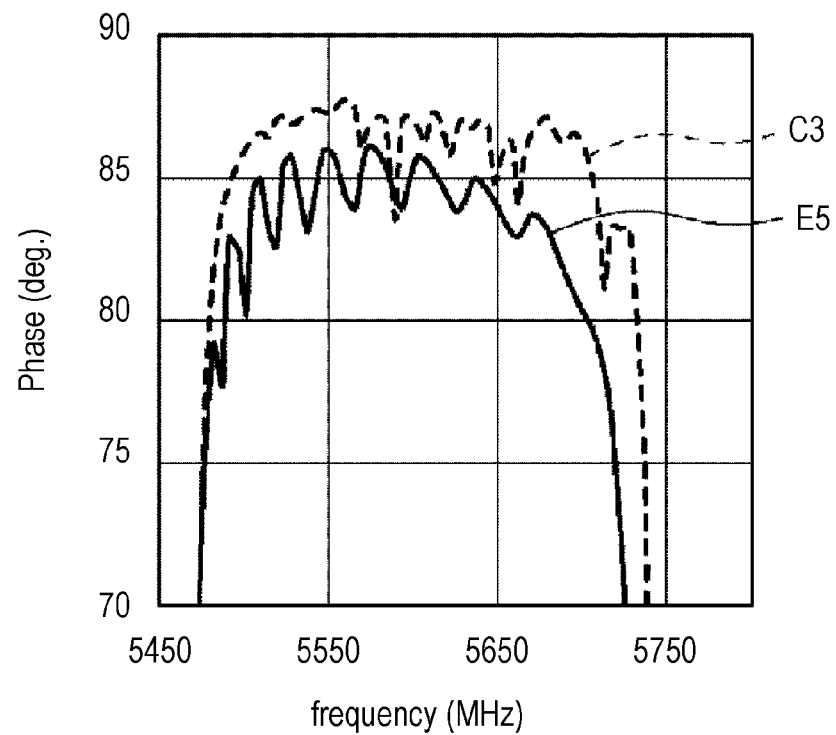
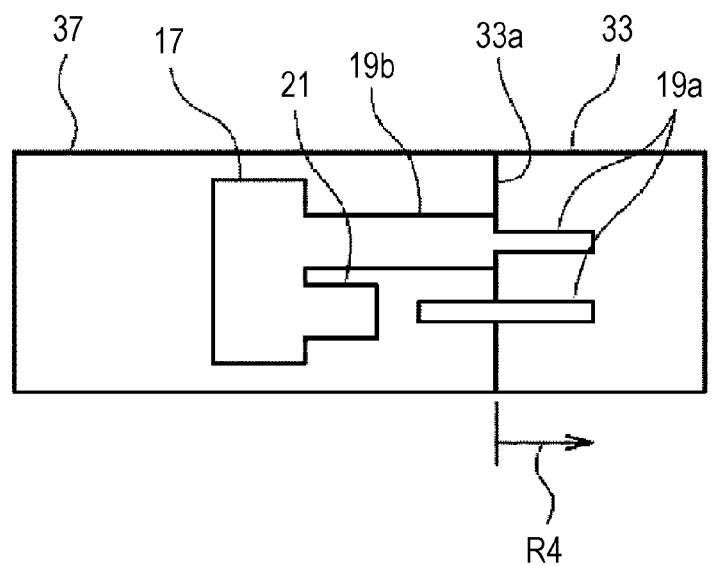

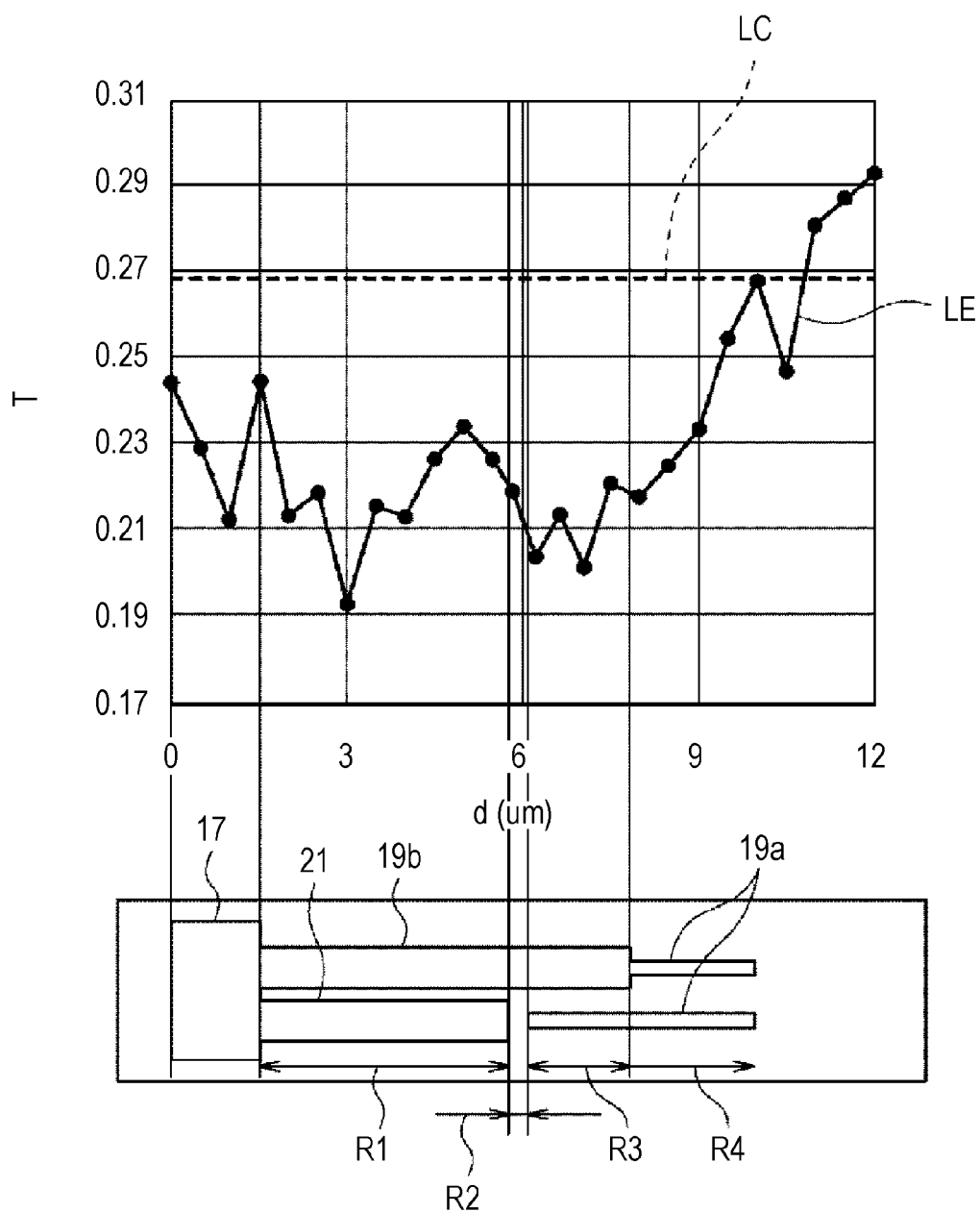

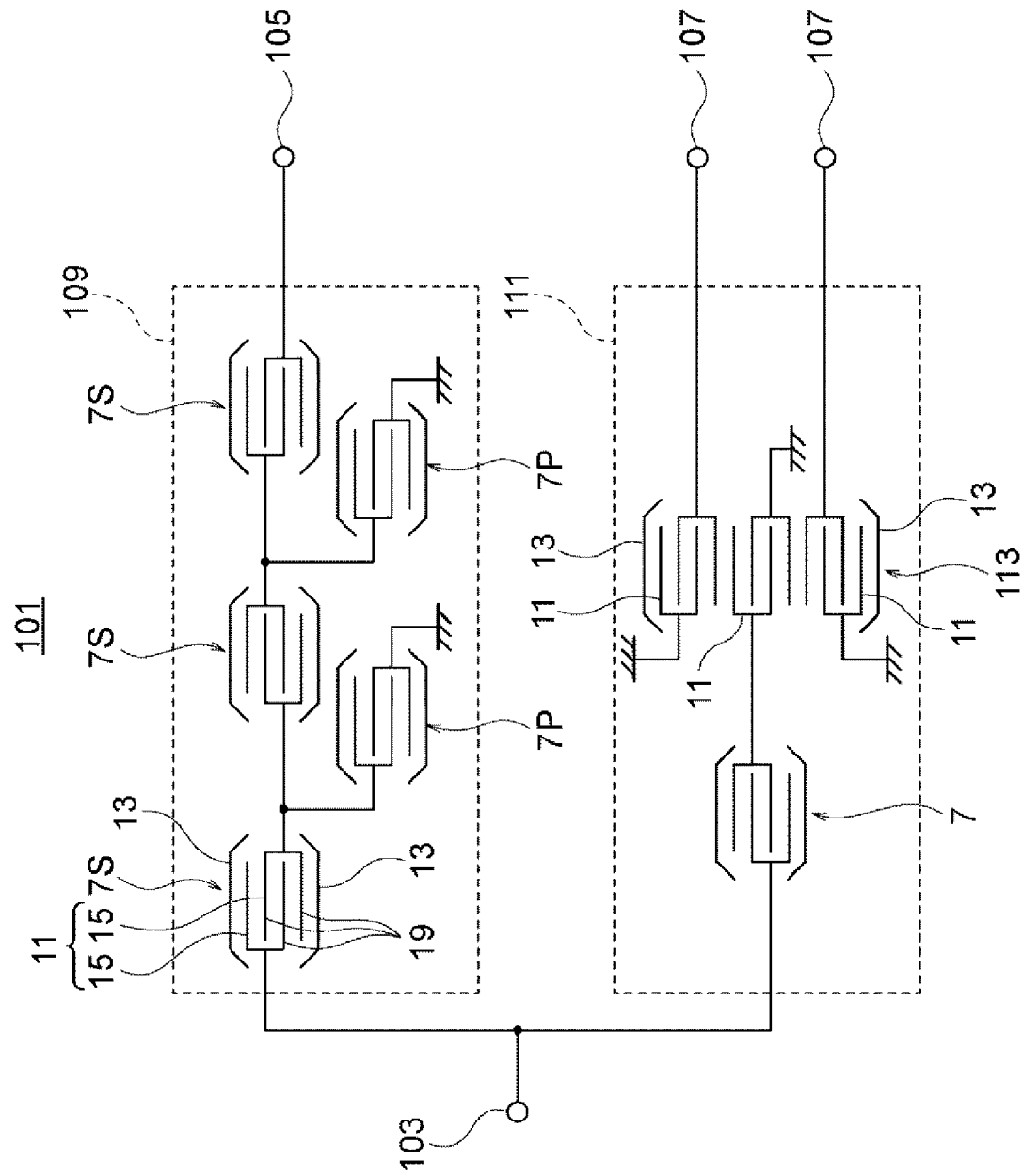

ELASTIC WAVE ELEMENT AND COMMUNICATION DEVICE

TECHNICAL FIELD

The present disclosure relates to an acoustic wave element capable of performing at least one of conversion from an acoustic wave to an electric signal or conversion from an electric signal to an acoustic wave and further relates to a communication device including the acoustic wave element.

BACKGROUND OF INVENTION

A known example of acoustic wave elements includes a piezoelectric layer and an IDT (Interdigital Transducer) electrode located on the piezoelectric layer (e.g., Patent Literature 1 or 2 listed below). The IDT electrode includes a pair of comb-shaped electrodes. Each of the comb-shaped electrodes includes a busbar and a plurality of electrode fingers extending from the busbar in parallel. The pair of comb-shaped electrodes is arranged in a state interdigitating with each other.

In Patent Literature 1, the piezoelectric layer is overlaid on an upper surface of a support including a cavity formed in the upper surface. The IDT electrode is disposed to overlap the cavity in a see-through plan view. In the see-through plan view, an edge of the cavity is located at a position outside the IDT electrode or overlapping the busbar. In Patent Literature 2, the electrode fingers each have a greater width in a base portion connected to the busbar than in the remaining portion. Note that the contents of Patent Literatures 1 and 2 may be incorporated herein by reference.

CITATION LIST

Patent Literature

Patent Literature 1: Japanese Unexamined Patent Application Publication No. 2012-257019
Patent Literature 2: International Publication No. 2020/100949

SUMMARY

According to an aspect of the present disclosure, an acoustic wave element includes a support, a piezoelectric layer on the support, and an IDT electrode on the piezoelectric layer. A cavity overlapping the IDT electrode in a see-through plan view is formed between the piezoelectric layer and the support. The IDT electrode includes a first busbar and a second busbar opposite to each other in a direction intersecting a first direction, a plurality of first electrode fingers extending from the first busbar toward the second busbar in parallel, and plurality of second electrode fingers extending from the second busbar toward the first busbar in parallel. The plurality of first electrode fingers and the plurality of second electrode fingers are arrayed alternately in the first direction. A region extending along an array of the plurality of first electrode fingers and the plurality of second electrode fingers in an intersection width over which the first electrode finger and the second electrode finger adjacent to each other overlap when viewing both the electrode fingers in the first direction is referred to as an intersection region. The intersection region includes a central region, a first end region, and a second end region. The central region includes a center position between the first busbar and the second busbar. The first end region is a region spanning from an edge of the central region on a side closer to the first busbar to an edge of the intersection region on a side closer to the first busbar. The second end region is a region spanning from an edge of the central region on a side closer to the second busbar to an edge of the intersection region on a side closer to the second busbar. The cavity overlaps the central region. An edge of the cavity on a side closer to the first busbar is located within a range from the edge of the central region on the side closer to the first busbar to an edge of the first busbar on a side opposite to the central region. The plurality of first electrode fingers each includes a first portion located in the central region, and a second portion located on a side closer to the first busbar or a side closer to the second busbar relative to the central region. A value of mass per unit length of the plurality of first electrode fingers above lower surfaces thereof in a second direction orthogonal to the first direction is greater in the second portions than in the first portions.

According to an aspect of the present disclosure, a communication device includes a filter including the acoustic wave element described above, an antenna connected to the filter, and an integrated circuit element connected to the antenna through the filter.

BRIEF DESCRIPTION OF THE DRAWINGS

FIG. 1 is a plan view illustrating a configuration of an acoustic wave element according to an embodiment.
FIG. 2 is an enlarged view of a region II in FIG. 1.
FIG. 3A is a sectional view taken along a line III-Ill in FIG. 2.
FIG. 3B is a sectional view illustrating a variation.
FIG. 5A illustrates a cavity position and the characteristics in the resonator according to Comparative Example.
FIG. 5B illustrates a cavity position and the characteristics in the resonator according to First Example.
FIG. 5C illustrates a cavity position and characteristics in a resonator according to Second Example.
FIG. 6A illustrates a cavity position and characteristics in a resonator according to Third Example.
FIG. 6B illustrates a cavity position and characteristics in a resonator according to Fourth Example.
FIG. 6C illustrates a cavity position and characteristics in a resonator according to Fifth Example.

FIG. 13A illustrates characteristics of a resonator in which the Duty of the wider portion is 0.80.

FIG. 17 is a schematic circuit diagram illustrating a configuration of a branching filter according to an embodiment.

DESCRIPTION OF EMBODIMENTS

Figure 4A:
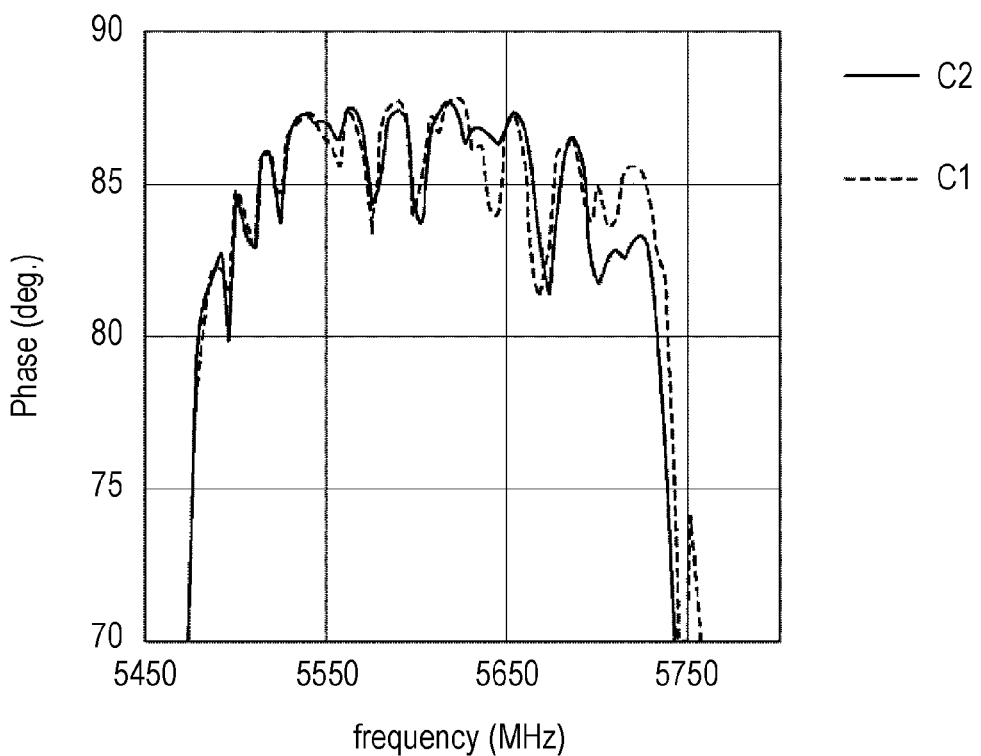
FIG. 4A is a graph illustrating characteristics of resonators according to Comparative Examples.

Embodiments according to the present disclosure will be described below with reference to the drawings. The drawings referred to in the following description are schematic drawings. Thus, for example, size ratios on the drawings are not always in agreement with actual ones.

In an acoustic wave element according to the present disclosure, any direction may be defined as an upward or downward direction. In the following, for the convenience of explanation, an orthogonal coordinate system with a D1 axis, a D2 axis, and a D3 axis is defined, and the terms "upper surface", "lower surface", and so on are used in some cases on an assumption that a positive side along the D3 axis is an upper side. Furthermore, the terms "in a plan view" or "in a see-through plan view" indicates a view looking at a target object in the direction of the D3 axis unless otherwise specified. Note that the D1 axis is defined to be parallel to a propagation direction of an acoustic wave propagating along an upper surface of a piezoelectric layer (described later), the D2 axis is defined to be parallel to the upper surface of the piezoelectric layer and orthogonal to the D1 axis, and that the D3 axis is defined to be orthogonal to the upper surface of the piezoelectric layer.

First Embodiment (Overall Configuration of Acoustic Wave Element)

FIG. 1 is a plan view illustrating a configuration of principal part of an acoustic wave element 1 (hereinafter simply referred to as an "element 1" in some cases) according to an embodiment.

The element 1 includes, for example, a composite substrate 3 and a conductive layer 5 located on an upper surface of the composite substrate 3. At least a partial region (e.g., a region illustrated in FIG. 1) of the upper surface of the composite substrate 3 has piezoelectricity (namely, the partial region is made of a piezoelectric body). Upon voltage being applied to the piezoelectric body from the conductive layer 5, an acoustic wave propagating through the piezoelectric body is excited. Additionally and/or alternatively, with an acoustic wave propagating through the piezoelectric body, electric charges are generated in the piezoelectric body, and voltage is applied to the conductive layer 5. The element 1 may constitute, for example, a resonator and/or a filter utilizing the above-described conversion between the acoustic wave and the voltage (electric signal).

An acoustic wave in any suitable mode may be utilized in the element 1. For example, a plate wave propagating through a piezoelectric body in the form of a thin plate may be utilized. Examples of the plate wave may include a Lamb wave in an A1 mode, a Lamb wave in an S0 mode, and SH (Shear Horizonal) plate wave. The Lamb wave has, as main components, a displacement component in the propagation direction (namely, in the D1 direction) and a displacement component in a thickness direction of the piezoelectric body (namely, in the D3 direction). The Lamb wave in the A1 mode is a Lamb wave with one node in the thickness direction. As an alternative, the acoustic wave may be a Rayleigh wave or a leaky wave.

Though not illustrated, the element 1 may include an insulating protective film covering the upper surface of the composite substrate 3 from above the conductive layer 5. The protective film may contribute to suppressing corrosion of the conductive layer 5 and/or to giving properties of temperature compensation. Materials of the protective film may be, for example, $SiO_2$, $Si_3N_4$, and Si. The protective film may be a multilayer body made of two or more among the above-mentioned materials.

The element 1 may further include an additional film overlapping the upper or lower surface of the conductive layer 5 and having a shape with an outline substantially falling within the conductive layer 5 in the see-through plan view. Such an additional film is made of, for example, an insulating material or a metallic material different in acoustic characteristics from the material of the conductive layer 5 and contributes to improving a reflection coefficient for the acoustic wave.

The element 1 may be packaged as appropriate. The packaging may be performed, for example, by mounting the element 1 with the illustrated configuration to be arranged such that the upper surface of the composite substrate 3 faces a substrate (not illustrated) with a gap interposed therebetween, and by sealing off the composite substrate 3 with molded resin from above. Alternatively, the packaging may be performed as wafer-level packaging by disposing a box-shaped cover on the composite substrate 3.

(Schematic Configuration of Conductive Layer)

The conductive layer 5 has, for example, a substantially constant thickness regardless of a position in a plane direction (direction parallel to a D1-D2 plane). The thickness of the conductive layer 5 may be set as appropriate depending on characteristics demanded for the element 1. The thickness of the conductive layer 5 may be, for example, 0.04 p or more and 0.20 p or less and/or 50 nm or more and 600 nm or less.

The conductive layer 5 is made of, for example, metal. The metal may be any suitable type and is, for example, aluminum (Al) or an alloy (Al alloy) containing Al as a main component. The Al alloy is, for example, an Al-copper (Cu) alloy. The conductive layer 5 may be composed of a plurality of metal layers. In addition, between Al or the Al alloy and the composite substrate 3, a relatively thin layer made of titanium (Ti) may be disposed to increase bonding strength therebetween.

In the illustrated example, the conductive layer 5 is formed to constitute a resonator 7. The resonator 7 is constituted as a so-called 1-port acoustic wave resonator. Thus, when an electric signal of a predetermined frequency is input from one of two terminals 9 that are conceptually and schematically illustrated in FIG. 1, resonance is generated, and the signal having generated the resonance can be output from the other of the two terminals 9.

The conductive layer 5 (from a different point of view, the resonator 7) includes the IDT electrode 11 and a pair of reflectors 13 located on both sides of the IDT electrode 11 in one-to-one correspondence. Strictly speaking, the resonator 7 includes a piezoelectric layer (described later) of the composite substrate 3, the piezoelectric layer taking part in the propagation of the acoustic wave. For the convenience of explanation, however, a combination of the IDT electrode 11 and the pair of reflectors 13 is referred to as the resonator 7 in some cases.

The IDT electrode 11 includes a pair of comb-shaped electrodes 15. Each of the comb-shaped electrodes 15 includes, for example, a busbar 17, a plurality of electrode fingers 19 extending from the busbar 17 in parallel, and dummy electrodes 21 each protruding from the busbar 17 between adjacent two of the electrode fingers 19. The pair of comb-shaped electrodes 15 is arranged such that the electrode fingers 19 interdigitate (intersect) with each other.

The busbar 17 is formed in an elongate shape extending linearly substantially in the propagation direction of the acoustic wave (namely, in the D1 direction) with a constant width. The pair of busbars 17 is opposite to each other in a direction orthogonal to the propagation direction of the acoustic wave (namely, in the D2 direction). Note that the busbar 17 may have a width varying depending on a position or may be inclined relative to the propagation direction of the acoustic wave.

The electrode fingers 19 basically have the same shape and size. Each of the electrode fingers 19 is formed in an elongate shape extending linearly substantially in the direction orthogonal to the propagation direction of the acoustic wave (namely, in the D2 direction). In each of the comb-shaped electrodes 15, the electrode fingers 19 are arrayed in the propagation direction of the acoustic wave. Moreover, the electrode fingers 19 of one comb-shaped electrode 15 and the electrode fingers 19 of the other comb-shaped electrode 15 are arrayed alternately in a basic form.

A pitch p of the electrode fingers 19 (e.g., a center-to-center distance between adjacent two of the electrode fingers 19) is basically constant within the IDT electrode 11. Part of the IDT electrode 11 may be a singular portion in terms of the pitch p. The singular portion is, for example, a narrow pitch portion in which the pitch p is narrower than in a most portion (e.g., 80% or more), a wide pitch portion in which the pitch p is wider than in the most portion, or a thinned-out portion in which a small number of the electrode fingers 19 is substantially thinned out.

When the term "pitch p" is used in the following, it indicates the pitch in a portion except for the above-described singular portion (namely, in a most portion of the electrode fingers 19) unless otherwise specified. When the pitch varies among the electrode fingers 27 in the most portion except for the singular portion, an average value of the pitches of the electrode fingers 27 in the most portion may be used as a value of the pitch p.

The number of the electrode fingers 19 may be set as appropriate depending on electrical characteristics and so on demanded for the resonator 7 (the element 1). FIG. 1 is a schematic view, and hence the electrode fingers 19 are illustrated in a smaller number than an actual number. In practice, the electrode fingers 19 in a larger number than in the illustrated example may be arrayed. The above point is similarly applied to strip electrodes 25 of the reflector 13 described later.

Lengths of the electrode fingers 19 are equal to one another in an example. The so-called apodization may be applied to the IDT electrode 11 such that the lengths (from a different point of view, an intersection width) of the electrode fingers 19 are changed depending on a position in the propagation direction. The length and width of each electrode finger 19 may be set as appropriate depending on the demanded electrical characteristics and so on.

The dummy electrodes 21 each have, for example, a shape projecting substantially in the direction orthogonal to the propagation direction of the acoustic wave with a constant width. Tip ends of the dummy electrodes 21 in one of the comb-shaped electrodes 15 are arranged to face tip ends of the electrode fingers 19 in the other comb-shaped electrode 15 in one-to-one correspondence with a gap G1 interposed therebetween. The IDT electrode 11 is not always needed to include the dummy electrodes 21.

The pair of reflectors 13 is located on both the sides of the plurality of IDT electrodes 11 in the propagation direction of the acoustic wave in one-to-one correspondence. In an example, the reflectors 13 may be held in an electrically floating state or may be given with a reference potential. The reflectors 13 may be formed in, for example, a lattice shape. In more detail, each of the reflectors 13 includes a pair of busbars 23 opposite to each other and a plurality of strip electrodes 25 extending between the pair of busbars 23. A pitch of the strip electrodes 25 and a pitch between the electrode finger 19 and the strip electrode 25 adjacent to each other are basically equal to that of the electrode fingers 19.

Upon application of voltage to the pair of comb-shaped electrodes 15, the voltage is applied to the upper surface of the composite substrate 3 with piezoelectricity through the electrode fingers 19, thereby causing the upper surface of the composite substrate 3 to vibrate. Thus, acoustic waves are excited to propagate along the upper surface of the composite substrate 3. On that occasion, the acoustic waves excited by the electrode fingers 19 have the same phase in a direction orthogonal to the electrode fingers 19 (i.e., in the D1 direction) when half wavelengths of the excited acoustic waves are substantially equal to the pitch p, and amplitudes of the excited acoustic waves are added. In other words, the acoustic wave having the half wavelength equal to the pitch p and propagating in the D1 direction is most easily excited. As a result, a component of the voltage applied to the IDT electrode 11, the component having a frequency equal to that of the acoustic wave having the half wavelength substantially equal to the pitch p, is converted to the acoustic wave. Furthermore, when acoustic waves are generated in the region of the upper surface of the composite substrate 3 where the pair of comb-shaped electrodes 15 is disposed, the acoustic wave having the half wavelength equal to the pitch p and propagating in the D1 direction is mainly converted to voltage based on the principle opposite to the above-described one. A resonator or a filter is realized by utilizing either one of those principles.

In the case of using the Lamb wave in the A1 mode as the acoustic wave, a propagation velocity (acoustic velocity) of that Lamb wave is higher than that of a general SAW (Surface Acoustic Wave). For instance, while the propagation velocity of the general SAW is 3000 to 4000 m/s, the propagation velocity of the Lamb wave in the A1 mode is 10000 m/s or higher. Accordingly, resonance in a higher frequency range than in the past can be realized with the pitch p equal to that in the past. For instance, a resonant frequency of 5 GHz or higher can be realized with the pitch p of 1 μm or more.

(Division of Region Between Busbars)

A region between the pair of busbars 17 in the upper surface of the composite substrate 3 may be conceptually divided into a plurality of regions in the D2 direction according to the shape of the IDT electrode 11. Such division may be utilized to set a range of a wider portion 19b (described later) of the electrode finger 19 in the D2 direction or to set a range of a cavity 33 (described later) in the composite substrate 3 in the D2 direction. In the description of this embodiment, the region between the pair of busbars 17 is divided as follows.

FIG. 2 is an enlarged view of a region II in FIG. 1.

In the following description, the electrode fingers 19 belonging to one of the comb-shaped electrodes 15 are denoted by electrode fingers 19A, and the electrode fingers 19 belonging to the other comb-shaped electrode 15 are denoted by electrode fingers 19B in some cases. Similarly, the busbar 17 belonging to the one comb-shaped electrode 15 is denoted by a busbar 17A, and the busbar 17 belonging to the other comb-shaped electrode 15 is denoted by a busbar 17B in some cases. The dummy electrodes 21 belonging to the one comb-shaped electrode 15 are denoted by dummy electrodes 21A, and the dummy electrodes 21 belonging to the other comb-shaped electrode 15 are denoted by dummy electrodes 21B in some cases. Moreover, a side closer to a center position between the pair of busbars 17 with respect to the D2 direction is referred to as an "inner side", and a side opposite to the center position is referred to as an "outer side" in some cases.

The region between the pair of busbars 17 includes a so-called intersection region R6 and two outer regions R5 located on both sides of the intersection region R6 in the D2 direction in one-to-one correspondence. The intersection region R6 is a region extending along an array of the electrode fingers 19A and the electrode fingers 19B in a width (intersection width) at which the electrode finger 19A and the electrode finger 19B adjacent to each other overlap when viewing at both the electrode fingers 19A and 19B in the propagation direction of the acoustic wave (namely, in the D1 direction). From a different point of view, the intersection region R6 is a region sandwiched between an imaginary line connecting tip ends of the electrode fingers 19A and tip ends of the electrode fingers 19B. The outer regions R5 are regions remaining after excluding the intersection region R6 from the region between the pair of busbars 17.

The intersection region R6 includes a central region R4 and two end regions R3 located on both sides of the central region R4 in the D2 direction in one-to-one correspondence. The central region R4 is a region including the center position between the pair of busbars 17. The end regions R3 are regions remaining after excluding the central region R4 from the intersection region R6. In other words, the end regions R3 are each a region spanning from an edge of the central region R4 on a side closer to one (or the other) of the busbars 17 to an edge of the intersection region R6 on a side closer to one (or the other) busbar 17. From a different point of view, the end regions R3 are each a region where tip portions of respective ones of the electrode fingers 19A and 19B are located.

Each of the outer regions R5 includes, for example, a dummy region R1 on a side closer to the busbar 17 and a gap region R2 on a side closer to the intersection region R6. The dummy region R1 is a region where the dummy electrodes 21 are located. In other words, the dummy region R1 spans from an inner edge (on a side closer to the central region R4) of one (or the other) of the busbars 17 to an imaginary line connecting tip ends of the dummy electrodes 21 protruding from the one (or the other) busbar 17. The gap region R2 is a region where the gap G1 between the tip ends of the dummy electrodes 21 and the tip ends of the electrode fingers 19 is located. In other words, the gap region R2 spans from an imaginary line connecting the tip ends of the electrode fingers 19A (or 19B) to the imaginary line connecting the tip ends of the dummy electrodes 21A (or 21B).

An edge of the intersection region R6 on a side closer to the busbar 17 (an edge of each end region R3 on a side closer to the busbar 17) and an edge of each outer region R5 on a side closer to the busbar 17 (an edge of each dummy region R1 on a side closer to the busbar 17) are, for example, rectilinear and parallel to the propagation direction of the acoustic wave (namely, in the D1 direction). However, those edges may be curvilinear, may be curved in an angled shape, may be inclined relative to the propagation direction, or may extend in a zigzag shape. From a different point of view, as mentioned above, the apodization may be applied to the IDT electrode 11. In addition, the busbars 17 may be curved or inclined relative to the propagation direction of the acoustic wave.

A distance between the edge of the central region R4 on the side closer to the busbar 17 and, for example, the edge of the intersection region R6 on the side closer to the busbar 17 (from a different point of view, a width of each end region R3) may be set to be constant regardless of a position in the D1 direction. Similarly, a distance between an edge of each gap region R2 on a side closer to the busbar 17 and, for example, the edge of the intersection region R6 on the side closer to the busbar 17 (from a different point of view, a width of each gap region R2) may be set to be constant regardless of a position in the D1 direction. However, the above-mentioned distances may be each different depending on a position in the D1 direction.

Relative relationships between the widths (lengths in the D2 direction) of the above-described various regions may be set as appropriate. In an example, the width of the intersection region R6 may be set to be greater than a total width of the two outer regions R5. In the case of the apotization being applied, the above relative relationship may be satisfied at a position where the width of the intersection region R6 is maximum. The width of the central region R4 may be set to be greater than a total width of the two end regions R3. The width of the single dummy region R1 may be set to be greater than that of the single gap region R2.

Practical values of the widths of the individual regions may be set as appropriate. In an example, the width of the intersection region R6, the width of each outer region R5, the width of each gap region R2, and the width of each dummy region R1 may be set to values that are substantially the same as and/or similar to those known in the art, and there are no particular limitations. Comparison among ranges of the above-mentioned widths in terms of the pitch p is, by way of example, as follows. The width of the intersection region R6 may be set to be 10 p or more and 200 p or less. The width of each outer region R5 may be set to be 0.2 p or more and 10 p or less. The width of each gap region R2 may be set to be 0.1 p or more and 9.9 p or less. The width of each dummy region R1 may be set to be 0.1 p or more and 9.9 p or less. A practical example of the width of each end region R3 will be described in the following explanation with regard to a length of the wider portion 19b in the D2 direction.

(Wider Portion of Electrode Finger)

Generally, the width of each electrode finger 19 is set to be constant over an entire length of the electrode finger 19. In this embodiment, however, the width of the electrode finger 19 is different depending on a position along a lengthwise direction thereof. This feature reduces spurious components in a transverse mode, for example. A detailed configuration of the electrode finger 19 is as follows.

As is apparent from the definition of the intersection region R6 and the outer regions R5, each electrode finger 19 includes a portion located in the intersection region R6 (the central region R4+the end regions R3) and a portion located in one (the gap region R2+the dummy region R1) of the two outer regions R5. A portion of the electrode finger 19, the portion being located in the central region R4, is referred to as a "main portion 19a". The electrode finger 19 includes, in at least part of a range (R3+R2+R1) from the edge of the central region R4 to an edge of the busbar 17 on a side closer to the central region R4, the wider portion 19b of which width is greater than a width (length in the D1 direction) of the main portion 19a.

As portions of the electrode finger 19 located outside the central region R4, there are two portions, namely the tip portion of the electrode finger 19 and a portion of the electrode finger 19 on a base side (on a side where the electrode finger 19 is connected to the busbar 17). In the electrode finger 19, the wider portion 19b may be formed in either one or both of the above-mentioned two portions. In the illustrated example, the wider portion 19b is disposed on the base side.

When the wider portion 19b is disposed on the base side of the electrode finger 19, the wider portion 19b may be disposed in any one or more of the end region R3, the gap region R2, and the dummy region R1. Furthermore, the wider portion 19b may be located in part in each of the above-mentioned regions or located over the entirety of each of the above-mentioned regions. In the illustrated example, the wider portion 19b is located over the entirety of the above-mentioned three regions (R3, R2 and R1). When the wider portion 19b is disposed on a tip side of the electrode finger 19 unlike the illustrated example, the wider portion 19b is located in the end region R3.

As described above, the wider portion 19b may be disposed on the base side and/or the tip side of the electrode finger 19 to be located in each or either one of the end regions R3. In such an example, although being paradoxically to the above-described definition of the central region R4 and the end region R3, a portion of the intersection region R6 where the wider portion 19b is located may be defined as the end region R3.

As seen from the above description that the wider portion 19b may be disposed in any suitable region outside the central region R4, a length of the wider portion 19b in the D2 direction may be set as appropriate. Moreover, when the wider portion 19b extends over an entire range from the busbar 17 to the edge of the central region R4 as in the illustrated example, the contents of the above-mentioned Patent Literature 2 (International Publication No. 2020/100949), for example, may be referred to for the length of the wider portion 19b in the D2 direction.

In Patent Literature 2, the acoustic wave element with the IDT electrode 11 according to this embodiment is fabricated as a prototype and frequency characteristics of the prototype are measured. In more detail, as illustrated in FIG. 2 of the present disclosure, of the length of the wider portion 19b from the busbar 17 to the central region R4, a length from the tip end of the dummy electrode 21 to the central region R4 (from a different point of view, a total of the width of the single gap region R2 and the width of the single end region R3) is defined as an "offset amount s1". A plurality of prototypes is fabricated in which the width of each gap region R2 is set to 0.3 p while the offset amount s1 is set to different values within a range of 0 p or more to 10 p or less. As a result of the measurement, it is found that, when the offset amount s1 is 1 p or more and 3 p or less (particularly, 1.5 p or more and 2.5 p or less), the frequency characteristics are improved. In addition, the drawing in Patent Literature 2 illustrates that the frequency characteristics can also be improved at the offset amount in a range other than the above-mentioned range.

Accordingly, the length of the wider portion 19b extending from the busbar 17 toward the central region R4 in the D2 direction may be set, for example, such that the offset amount s1 is more than 0 p and 10 p or less, 1 p or more and 3 p or less, or 1.5 p or more and 2.5 p or less. From a different point of view, the width of the end region R3 may be set to be, for example, more than 0 p and 10 p or less, 0.5 p or more and 2.5 p or less, or 1.0 p or more and 2.0 p or less. When the width of the end region R3 is set to any of the above-mentioned values, the width of the central region R4 may be set to be 65% or more of the width of the intersection region R6.

The width of the wider portion 19b may be set as appropriate. The contents of Patent Literature 2, for example, may be referred to for the width of the wider portion 19b. As described above, in Patent Literature 2, the acoustic wave element with the IDT electrode 11 according to this embodiment is fabricated as a prototype, and frequency characteristics of the prototype are measured. In more detail, the width of the electrode finger 19 is specified in terms of Duty (=width/pitch p) that is a ratio of the width of the electrode finger 19 to the pitch p of the electrode fingers 19. The plurality of prototypes is fabricated in which the Duty of the main portion 19a is set to different values within a range of 0.35 or more and 0.50 or less, and the Duty of the wider portion 19b is set to different values in a range from a value equal to or greater than the Duty of the main portion 19a or more to 0.75 or less. As a result of the measurement, it is found that the frequency characteristics are improved basically when the Duty of the wider portion 19b is greater than that of the main portion 19a with a difference of 0.5 or more and 1.50 or less therebetween. Moreover, according to later-described simulation calculations in the present disclosure, an effect of reducing the spurious components in the transverse mode is obtained in the case in which the Duty of the main portion 19a is set to 0.50 while the Duty of the wider portion 19b is set to a different value in a range of 0.60 or more and 0.80 or less.

Accordingly, the Duty of the wider portion 19b may be set to be, for example, 0.40 or more and 0.80 or less, 0.40 or more and 0.65 or less, or 0.50 or more and 0.60 or less on the premise that the Duty of the wider portion 19b is greater than that of the main portion 19a by 0.05 or more. Additionally and/or alternatively, the Duty of the wider portion 19b may be set to a value greater than that of the main portion 19a with a difference of 0.5 or more and 1.5 or less therebetween. From a different point of view, the width of the wider portion 19b may be set to be 1.05 times or more or 1.1 times or more and 2 times or less or 1.3 times or less the width of the main portion 19a. Those upper and lower limits may be combined with each other as appropriate.

A density and a thickness of the electrode finger 19 is, for example, constant over the entire length of the electrode finger 19. Accordingly, from a different point of view, the wider portion 19b can be said as being a portion in which mass per unit length in the D2 direction is greater than in the main portion 19a.

The width of the dummy electrode 21 can be set as appropriate, for example, within a range of the width of the main portion 19a or more and the width of the wider portion 19b or less. In an example, the width of the dummy electrode 21 may be equal to the width of the wider portion 19b of the electrode finger 19 (in the illustrated example), equal to the width of the main portion 19a of the electrode finger 19, or different from the widths of both the wider portion 19b and the main portion 19a.

(Composite Substrate)

FIG. 3 is a sectional view taken along a line III-III in FIG. 2.

The composite substrate 3 includes, for example, a support 29 and a piezoelectric layer 31 located on an upper surface of the support 29. The piezoelectric layer 31 constitutes at least a partial region of an upper surface of the composite substrate 3. At least a portion of the conductive layer 5, the portion constituting the resonator 7, is located on an upper surface of the piezoelectric layer 31. With such a configuration, conversion between the acoustic wave and the electric signal can be realized as described above. In the description of this embodiment, it is supposed unless otherwise specified that the piezoelectric layer 31 constitutes the entire upper surface of the composite substrate 3 and the entirety of the conductive layer 5 is located on the upper surface of the piezoelectric layer 31.

The cavity 33 is formed between the support 29 and the piezoelectric layer 31. The cavity 33 overlaps the resonator 7 (from a different point of view, the IDT electrode 11) in a see-through plan view. This configuration makes easier, for example, excitation of an acoustic wave in a particular mode as described later.

The cavity 33 may be provided by forming a recess in at least one of the upper surface of the support 29 or a lower surface of the piezoelectric layer 31. In the illustrated example, the cavity 33 is provided by forming a recess in the upper surface of the support 29. In more detail, the support 29 includes a support substrate 35 and a cavity layer 37 located on an upper surface of the support substrate 35. An opening penetrating through the cavity layer 37 in a thickness direction is formed in the cavity layer 37, and the opening serves as the cavity 33. However, unlike the illustrated example, a recess may be formed in the upper surface of the support 29 that is formed as an integral body.

A thickness of the composite substrate 3 is, for example, substantially constant in a plane direction. A practical value of the thickness may be set as appropriate. In an example, the thickness of the composite substrate 3 may be set to such a value as ensuring sufficient strength of a wafer from which many elements 1 are to be fabricated. Thicknesses of the individual layers (29, 31, 35 and 37, including 37a and 37b described later) constituting the composite substrate 3 are substantially constant in the plane direction except for, for example, a region where the thickness is reduced with formation of the cavity 33.

(Support)

A thickness of the support substrate 35 may be set as appropriate. In an example, the thickness of the support substrate 35 is greater than each of a thickness of the piezoelectric layer 31 and a thickness of the cavity layer 37 and is greater than a total thickness of those two layers.

A material of the support substrate 35 may be selected as appropriate. The support substrate 35 (in other words, a lower portion than a portion forming the upper surface of the support 29) gives a less influence or no influence upon boundary conditions for an acoustic wave propagating through the interior of the piezoelectric layer 31 unlike the cavity layer 37. Accordingly, the degree of freedom in selection of the material of the support substrate 35 is high. The material of the support substrate 35 may be selected with intent to increase, for example, strength of the composite substrate 3.

The material of the support substrate 35 is, for example, an insulating material. The insulating material is, for example, resin or ceramic. The insulating material may be a composite material formed by impregnating resin into a base, or a composite material formed by mixing inorganic particles into resin. Alternatively, the insulating material may be a single material instead of the composite material. The support substrate 35 may be entirely made of one type of material or made of a plurality of materials in the form of, for example, a multilayer body in which a plurality of layers made of different materials is laminated. The support substrate 35 may be made of a material with a lower thermal expansion coefficient than the piezoelectric layer 31. In that case, a probability of change in frequency characteristics of the element 1 due to temperature change can be reduced. Examples of the above-mentioned material may include semiconductors such as silicon, monocrystals such as sapphire, and ceramics such as an aluminum-oxide sintered body.

The thickness of the cavity layer 37 (from a different point of view, a height of the cavity 33) may be set as appropriate. In an example, the thickness of the cavity layer 37 may be set to be as small as possible within a range not causing contact between a surface lying over the cavity 33 (a lower surface of the piezoelectric layer 31) and a surface lying at a bottom of the cavity 33 (the upper surface of the support substrate 35) in a situation of intended use, or may be set to a value exceeding such a range. Furthermore, the thickness of the cavity layer 37 may be, for example, smaller than, equal to, or greater than that of the piezoelectric layer 31.

A material of the cavity layer 37 may be selected as appropriate. The cavity layer 37 (in other words, the portion forming the upper surface of the support 29) is in contact with the lower surface of the piezoelectric layer 31 and hence gives an influence upon the boundary conditions for the acoustic wave propagating through the interior of the piezoelectric layer 31. Thus, as understood from the result of simulation calculations described later, the characteristics of the element 1 can be improved with selection of the material of the above-mentioned portion. However, regardless of which type of material is selected, an acoustic difference between the above-mentioned portion and the cavity 33 (in other words, gas) is distinct, and advantageous effects (described later) of this embodiment are obtained.

An acoustic impedance and/or an acoustic velocity of the material of the cavity layer 37 may be relatively high or relatively low. The acoustic impedance is given as the product of the density and the acoustic velocity. The term "acoustic velocity" used here is given as the root of a value resulting from dividing an elastic modulus (e.g., a Young's modulus) by a density. Stated in another way, the density and/or the elastic modulus of the cavity layer 37 may be relatively high or relatively low.

Electrical resistance of the material of the cavity layer 37 may be relatively high or relatively low. In the latter case, the cavity layer 37 can be said as being a low resistance layer. The low resistance layer may have sheet resistance of, for example, $5 \times 10^3 \Omega$ or more and $5 \times 10^7 \Omega$ or less. These values are in accordance with International Publication No. 2019/022006. When the sheet resistance has dependency on frequency, the above-mentioned values of the sheet resistance may be satisfied at any frequency within a range from the resonant frequency to the anti-resonant frequency of the IDT electrode 11.

Practical examples of the material of the cavity layer 37 may include silicon (Si), silicon dioxide ($SiO_2$), aluminum nitride (AlN), hafnium oxide ($HfO_2$), tantalum pentoxide ($Ta_2O_5$), zirconium oxide ($ZrO_2$), and titanium oxide ($TiO_2$). The low resistance layer may be made of, for example, a material that is obtained by diffusing metal or the like into an insulating material such as SiOx and by adjusting a resistivity of the mixture.

The cavity layer 37 may be entirely made of one type of material or made of a plurality of materials in the form of, for example, a multilayer body in which a plurality of layers made of different materials is laminated.

FIG. 3B is a sectional view illustrating an example of the cavity layer 37 made of a plurality of layers and corresponds to part of FIG. 3A.

The cavity layer 37 illustrated in FIG. 3B may include a first layer 37a and a second layer 37b lying over an upper surface of the first layer 37a. The second layer 37b forms an upper surface of the cavity layer 37 and is in contact with the piezoelectric layer 31. In an example, the second layer 37b is thinner than the first layer 37a. Such a configuration enables, for example, a material of the second layer 37b to be selected in consideration of the boundary conditions for the acoustic wave propagating through the piezoelectric layer 31. On the other hand, the thickness of the cavity layer 37 (from a different point of view, the height of the cavity 33), strength of the cavity layer 37, and/or bonding strength with the support substrate 35 can be ensured with the first layer 37a.

The above description with regard to the material of the cavity layer 37 may be similarly applied to materials of the first layer 37a and the second layer 37b. In an example, the materials of the first layer 37a and the second layer 37b may be each any of the above-described materials such as Si, $SiO_2$, AlN, and $HfO_2$. Furthermore, the second layer 37b may be the above-mentioned low resistance layer. The second layer 37b may be formed by injecting a predetermined element, such as a metal, into the upper surface of the cavity layer 37, that upper surface being made of the material of the first layer 37a, or by releasing a predetermined element from the upper surface of the cavity layer 37 on the contrary to the above case.

The materials described above as examples of the material of the cavity layer 37 may also be used for the support substrate 35. Similarly, the materials described above as examples of the material of the support substrate 35 may also be used for the cavity layer 37. As described above, unlike the illustrated example, the support 29 may be constituted in the entirely integral form instead of including the cavity layer 37 and the support substrate 35. The material of the support 29 in such a case may be selected from among the materials described as the examples of the material of the cavity layer 37 and/or the material of the support 29.

(Piezoelectric Layer)

The piezoelectric layer 31 is made of, for example, a monocrystal with piezoelectricity. Examples of materials forming such a monocrystal may include lithium tantalate ($LiTaO_3$, hereinafter abbreviated to "LT" in some cases), lithium niobate ($LiNbO_3$, hereinafter abbreviated to "LN" in some cases), and quartz ($SiO_2$). Cut angles, a planar shape, and various dimensions may be set as appropriate. Alternatively, the piezoelectric layer 31 may be made of a polycrystal.

Practical examples of the cut angles are as follows. When LT is used for the piezoelectric layer 31, the cut angles may be given as (0°±10°, 0° or more and 55° or less, 0°±10°) in terms of Euler angles ($\phi$, $\theta$, $\psi$). From a different point of view, LT is adapted for rotated Y-cut X propagation. A Y-axis is inclined at an angle of 90° or more and 145° relative to a normal line (D3-axis) with respect to the piezoelectric layer 31. An X-axis is substantially parallel to the upper surface (D1-axis) of the piezoelectric layer 31. However, the X-axis and the D1-axis may be relatively inclined with a difference of −10° or more and 10° or less in an XZ plane or a D1D2 plane.

When LN is used for the piezoelectric layer 31, the cut angles may be given as (0°±10°, 15°±10°, 0°±10°) in terms of Euler angles ($\phi$, $\theta$, $\psi$). From a different point of view, LN is adapted for rotated Y-cut X propagation. A Y-axis is inclined at an angle of 105°±10° relative to the normal line (D3-axis) with respect to the piezoelectric layer 31. The cut angles may be given as (0°±10°, 0°±15°, $\psi$) in terms of Euler angles. $\psi$ is 0° or more and 360° or less. The cut angles may be given as (0°±5°, 0°±5°, $\psi$). From a different point of view, LN may be used to form a Z-cut substrate.

The thickness of the piezoelectric layer 31 may be set as appropriate. In an example, the thickness of the piezoelectric layer 31 may be set to be 1.5 p or less in the case of using the pitch p (except for the singular value of the pitch p as described above) to express the thickness. Furthermore, the thickness of the piezoelectric layer 31 may be set to be 0.3 p or more and 0.6 p or less. By setting the cut angles and the thickness of the piezoelectric layer 31 as described above, the Lamb wave in the A1 mode or an acoustic wave in a vibration mode close to the former, for example, can be more easily utilized as the acoustic wave.

The lower surface of the piezoelectric layer 31 is exposed to, for example, the cavity 33. However, the lower surface of the piezoelectric layer 31 may be covered in at least part (e.g., an entire surface) including a region overlapping the cavity 33 by a thinner layer than the piezoelectric layer 31. Such a thinner layer may be made of any of the materials described above as the examples of the material of the cavity layer 37. The thinner layer may be the low resistance layer. The thinner layer made of a different material from that of the piezoelectric layer 31 may be formed by injecting a predetermined element into the lower surface of the piezoelectric layer 31, or by releasing a predetermined element from the lower surface of the piezoelectric layer 31 on the contrary to the above case.

(Cavity)

The cavity 33 is enclosed in an example. Gas, for example, is present in the cavity 33. The gas is, for example, air or inert gas. Nitrogen can be used as an example of the inert gas. A gas pressure in the cavity 33 may be lower than, equal to, or higher than the atmospheric pressure under a temperature environment in which the element 1 is supposed to be used.

A position, shape, and size of the cavity 33 may be set as appropriate. As illustrated in FIG. 1, the cavity 33 overlaps at least part of the resonator 7 in the see-through plan view.

In other words, the cavity 33 overlaps at least part of the IDT electrode 11. In more detail, the cavity 33 overlaps, for example, at least part (e.g., the entirety) of the central region R4.

In the see-through plan view, edges 33a of the cavity 33 on both sides in the D2 direction (from a different point of view, on sides closer to the busbars 17) overlap, for example, a region where the IDT electrode 11 is disposed. In more detail, the edges 33a are each located at any position within a range (the end region R3, the gap region R2, and the dummy region R1) from the edge of the central region R4 on the side closer to the busbar 17 to an edge of the busbar 17 on an outer side (on a side opposite to the central region R4).

When the wording "in the see-through plan view, the edges 33a of the cavity 33 are located within a predetermined range" is used, the edges 33a may be each located at an edge of the predetermined range (namely, at a boundary between the predetermined range and another range). In the above-described example, the edge 33a may be located, for example, at the edge of the central region R4 on the side closer to the busbar 17 or the outer edge of the busbar 17. Even when the wording "in the see-through plan view, the edge 33a is located at the edge of the predetermined range" is used, it is a matter of course that a positional relationship may contain a tolerance. From this point of view, the edge 33a may be located outside the predetermined range. A boundary between regions adjacent to each other may be interpreted as belonging to both the regions unless otherwise specified or unless a contradiction arises.

In the following description, a distance from the outer edge of the busbar 17 to the edge 33a of the cavity 33 is referred to as an "inward extension amount d" (FIG. 3A) of the support 29 (the cavity layer 37) in some cases.

In the see-through plan view, edges 33b of the reflector 13 on both the sides of the cavity 33 in the D1 direction (the propagation direction of the acoustic wave) are located, for example, outside the region where the resonator 7 is disposed. Stated in another way, the edges 33b are located outside the region where the IDT electrode 11 is disposed. In the case of a longitudinally coupled multimode filter in which two or more IDT electrodes 11 are arrayed in the D1 direction and the reflectors 13 are disposed on both the sides of the IDT electrodes 11 in one-to-one correspondence, the edges 33b may be located, for example, outside a region where the above-mentioned filter is disposed.

In the see-through plan view, the edges 33a of the cavity 33 on the sides closer to the busbars 17 are, for example, parallel to the propagation direction of the acoustic wave (namely, in the D1 direction), the edges of the intersection region R6, and/or the edges of the busbars 17. From a different point of view, distances from the edges 33a to the edges of the intersection region R6 and/or the edges of the busbars 17 are constant. The edges 33a extend rectilinearly.

However, the distances from the edges 33a to the edges of the intersection region R6 and/or the edges of the busbars 17 may vary. Furthermore, the edges 33a may be curvilinear, may be curved in an angled shape, or may extend in a zigzag shape. In those cases, the above description (or the following description) related to the position of each edge 33a may be true for part of the edge 33a, large part (e.g., 80% or more of a length of the edge 33a when the edge 33a is projected onto the D1 axis in parallel to the D2 direction), or the entirety of the edge 33a. When the edge 33a includes a portion inclined and/or curved relative to the D1 direction, the acoustic wave reflected at the edge 33a, for example, can be more easily scattered.

In the see-through plan view, the edges 33b of the cavity 33 on both sides in the D1 direction extend rectilinearly orthogonally to the D1 direction in an example. However, the edges 33a may be inclined relative to the direction orthogonal to the D1 direction, may be curvilinear, may be curved in an angled shape, or may extend in a zigzag shape.

(Edges of Cavity and Wider Portions of Electrode Fingers)

In this embodiment, as described above, the edges 33a of the cavity 33 on the sides closer to the busbars 17 are located in the region where the IDT electrode 11 is disposed. Furthermore, the plurality of electrode fingers 19 of the IDT electrode 11 includes the wider portions 19b. The spurious components in the transverse mode can be reduced and the characteristics of the element 1 can be improved by combining the above-mentioned two features with each other. Details are as follows.

Figure 4B:
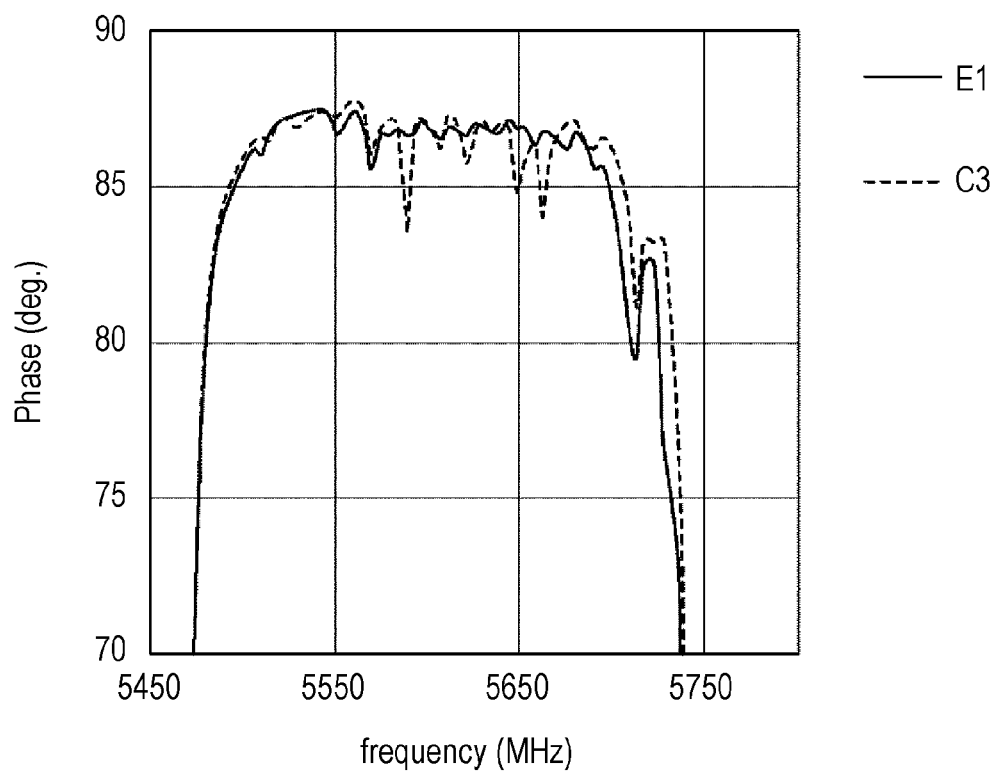
FIG. 4B is a graph illustrating characteristics of resonators according to Comparative Example and Example.

FIGS. 4A and 4B are graphs illustrating characteristics of resonators according to Comparative Examples and Example. In these graphs, the horizontal axis represents frequency. The vertical axis represents phase of impedance. Those graphs are obtained with simulation calculations.

The resonator 7 has a resonant frequency at which an absolute value of the impedance takes a local minimum and an anti-resonant frequency at which the absolute value of the impedance takes a local maximum. Generally, it is said that, in a range between the resonant frequency and the anti-resonant frequency, characteristics of the resonator 7 are improved as the phase of the impedance is closer to 90°. It is also said that, outside the above-mentioned range, the characteristics of the resonator 7 are improved to a larger extent as the phase of the impedance is closer to −90°. In FIGS. 4A and 4B, the horizontal axis substantially corresponds to the range between the resonant frequency and the anti-resonant frequency.

FIG. 4A indicates characteristics of First Comparative Example C1 and Second Comparative Example C2. In First Comparative Example C1 and Second Comparative Example C2, the electrode fingers 19 do not include the wider portions 19b unlike the embodiment. Moreover, in First Comparative Example C1, the edges 33a of the cavity 33 are located outside the IDT electrode 11 unlike the embodiment. In Second Comparative Example C2, the edges 33a of the cavity 33 overlap the IDT electrode 11 as in the embodiment. Other conditions than mentioned above are the same in both the Comparative Examples.

In each of First Comparative Example C1 and Second Comparative Example C2, frequencies at which the phase of the impedance is singularly reduced are present within a frequency range where the phase of the impedance is to be 90°. In other words, the spurious components in the transverse mode are generated. The magnitudes and the number of the spurious components are substantially the same and/or similar between First Comparative Example C1 and Second Comparative Example C2. Thus, in the case of using the electrode fingers 19 not including the wider portions 19b, a significant difference in the effect of reducing the spurious components in the transverse mode is not generated depending on whether the edges 33a of the cavity 33 overlap the IDT electrode 11.

FIG. 4B indicates characteristics of Third Comparative Example C3 and First Example E1. In Third Comparative Example C3 and First Example E1, the electrode fingers 19 include the wider portions 19b like the embodiment. Moreover, in Third Comparative Example C3, the edges 33a of the cavity 33 are located outside the IDT electrode 11 unlike the embodiment. In First Example E1, the edges 33a of the cavity 33 overlap the IDT electrode 11 as in the embodiment.

Other conditions than mentioned above are the same in the above-mentioned three Comparative Examples and First Example E1.

In Third Comparative Example C3, the spurious components are reduced in comparison with those in First Comparative Example C1 and Second Comparative Example C2, but relatively large spurious components are still present. By contrast, in First Example E1, amplitudes of the spurious components are reduced in comparison with those in Third Comparative Example C3.

As described above, the amplitudes of the spurious components are reduced only with a combination of two features, namely the feature that the edges 33a of the cavity 33 on the sides closer to the busbars 17 are located in the region where the IDT electrode 11 is disposed, and the feature that the plurality of electrode fingers 19 of the IDT electrode 11 includes the wider portions 19b. The reason is not exactly clear. However, the following is conceivable as the reason. Each of the wider portions 19b increases the mass of the electrode finger 19 per unit length in the D2 direction and hence reduces the acoustic velocity in the region outside the central region R4. In addition, the support 29 reduces the acoustic velocity in the piezoelectric layer 31 near the edges 33a of the cavity 33. As a result of superposed effect of those two features, the boundary conditions between the central region R4 and the region outside the central region R4 are made more distinct, and the spurious components in the transverse mode are reduced. In consideration of the above reason, even when the length of the wider portions 19b in the D2 direction and the inward extension amount d of the support 29 into the IDT electrode 11 are small, it does not matter. This is because the spurious components in the transverse mode are reduced to some extent even in such a case.

From the viewpoint of reducing the spurious components in the transverse mode, the edges 33a of the cavity 33 may be located on an inner side of the central region R4 than the edges of the central region R4 on the sides closer to the busbars 17. In that case, however, an area of the central region R4 is reduced. As a result, the phase of the impedance is reduced as a whole. Thus, a limit position of each edge 33a on the side closer to the central region R4 may be desirably set to the edge of the central region R4.

Common conditions in the above-described Comparative Examples and Examples are as follows.

Piezoelectric layer 31:
    Material: LN
    Cut angle: 105° rotated Y-cut X-propagation
    Thickness: 0.44 μm
Cavity layer 37:
    Material: Si
IDT electrode 11:
    Material: Al
    Thickness: 0.11 μm
    Pitch p: 1.0 μm
    Width of the busbar 17: 1.5 μm
    Width of the intersection region R6: 40 p
    Width of the outer region R5: 4.32 μm
    Width of the dummy region R1: 4 μm
    Width of the gap region R2: 0.32 μm The thickness of the cavity layer 37 is set to be relatively thick. In other words, it is assumed that the material of the support substrate 35 does not affect the boundary conditions of the acoustic wave.

Conditions of the electrode finger 19 in Second Comparative Example C2, Third Comparative Example C3, and First Example E1 are as follows.

Duty of the main portion 19a: 0.50
    Duty of the wider portion 19b: 0.60
    Width of the end region R3: 1.68 μm For the electrode finger 19 in First Comparative Example C1, the Duty of the entire electrode finger is denoted as the Duty of the main portion 19a.

In the simulation calculations for FIGS. 4A and 4B and other various simulation calculations described later, the resonator 7 has the same configuration as that illustrated in FIGS. 1, 2 and 3A (or 3B) unless otherwise specified. For instance, the various regions (R1 to R6) and the cavity 33 each have a rectangular shape with long sides parallel to the propagation direction of the acoustic wave (namely, in the D1 direction). The wider portion 19b is disposed on the base side of the electrode finger 19 and extends over the range (R1+R2+R3) from the busbar 17 to the edge of the central region R4 on the side closer to the busbar 17.

(Specific Position of Cavity Edge)

Each edge 33a of the cavity 33 on the side closer to the busbar 17 may be located at any appropriate position within the range from the edge of the central region R4 on the side closer to the busbar 17 to the edge of the busbar 17 on the outer side (on the side opposite to the central region R4). When the edge 33a is located within the above-mentioned range, the effect of reducing the spurious components in the transverse mode is expected. Examples of the characteristics of the resonator 7 will be described below in relation to the cases in which the position of the edge 33a (from a different point of view, the inward extension amount d) is varied.

FIGS. 5A to 5C and FIGS. 6A to 6C illustrate the results of the simulation calculations performed on the characteristics of the resonator 7. In each of those drawings, an upper zone represents a sectional view analogous to FIGS. 4A and 4B. A lower zone schematically represents a positional relationship between the edge 33a of the cavity 33 and the IDT electrode 11.

FIG. 5A corresponds to Comparative Example (the above-described Third Comparative Example C3) in which the edge 33a of the cavity 33 is located on the outer side of the IDT electrode 11. FIG. 5B corresponds to Example (the above-described First Example E1) in which the edge 33a is located at the outer edge of the busbar 17. FIG. 5C corresponds to Second Example E2 in which the edge 33a is located in an intermediate portion of the busbar 17. FIG. 6A corresponds to Third Example E3 in which the edge 33a is located in the dummy region R1. FIG. 6B corresponds to Fourth Example E4 in which the edge 33a is located at the edge of the intersection region R6. FIG. 6C corresponds to Fifth Example E5 in which the edge 33a is located at the edge of the central region R4.

Other conditions than the position of the edge 33a of the cavity 33 are the same among the above-described one Comparative Example and five Examples, and they are the same as and/or similar to those in First Example E1 described above with reference to FIG. 4B. In Third Comparative Example C3, a distance between the edge 33a and the busbar 17 is 1 μm. In First Example E1, a distance by which the cavity layer 37 (the edge 33a) enters from the outer edge of the busbar 17 toward the central region R4 (namely, the inward extension amount d in FIG. 3A) is 0 μm. In Second Example E2, the inward extension amount d is 1 μm. In Third Example E3, the inward extension amount d is 3 μm. In Fourth Example E4, the inward extension amount d is 5.82 μm. In Fifth Example E5, the inward extension amount d is 7.5 μm.

In the examples illustrated in FIGS. 5A to 5C and 6A to 6C, when the edge 33a of the cavity 33 on the side closer to the busbar 17 is located within the range from the outer edge of the busbar 17 to the edge of the intersection region R6 (FIGS. 5B to 6B), the spurious components in the transverse mode are reduced in comparison with those in Third Comparative Example. On the other hand, when the edge 33a is located at the edge of the central region R4 (FIG. 6C), it cannot be clearly said that the spurious components are reduced, and the phase of the impedance is reduced as a whole. Thus, as seen from those examples, a boundary of a position range of the edge 33a on the side closer to the central region R4 in which the spurious components can be reduced is present at any position within the end region R3.

(Evaluation Index)

An evaluation index for evaluating the characteristics of the resonator 7 is first defined. Then, influences of the position of the edge 33a of the cavity 33 on the side closer to the busbar 17 upon the characteristics of the resonator 7 are examined in detail on the basis of the evaluation index.

A value obtained by averaging phase values of the impedance over the frequency range from the resonant frequency to the anti-resonant frequency is defined as a phase average value Pm. It is here assumed that an overall magnitude of the phase of the impedance is evaluated on the basis of the phase average value Pm. As seen from the above description, the characteristics are improved to a larger extent as the phase average value Pm is greater (namely, closer to 90°).

A value obtained by averaging absolute values of change rates for change in the phase of the impedance with respect to change in frequency over the frequency range from the resonant frequency to the anti-resonant frequency is defined as an index T in the transverse mode. It is here assumed that the spurious components in the transverse mode are estimated on the basis of the index T. As the phase of the impedance varies to a larger extent, the index T increases. Accordingly, as the index T takes a smaller value, the spurious components are smaller, the number of the spurious components is reduced, and/or the characteristics are improved. Ideally, the index T is 0.

(Position of Cavity Edge for Each Material)

Changes in the phase average value Pm and the index T with respect to change in the inward extension amount d were determined for each of the materials of the cavity layer 37 with simulation calculations. Simulation conditions are the same among a plurality of simulation cases except for the material of the cavity layer 37 and the inward extension amount d and are also the same as those in the simulation cases described above with reference to FIGS. 4A to 6C.

(Si)

Figure 7A:
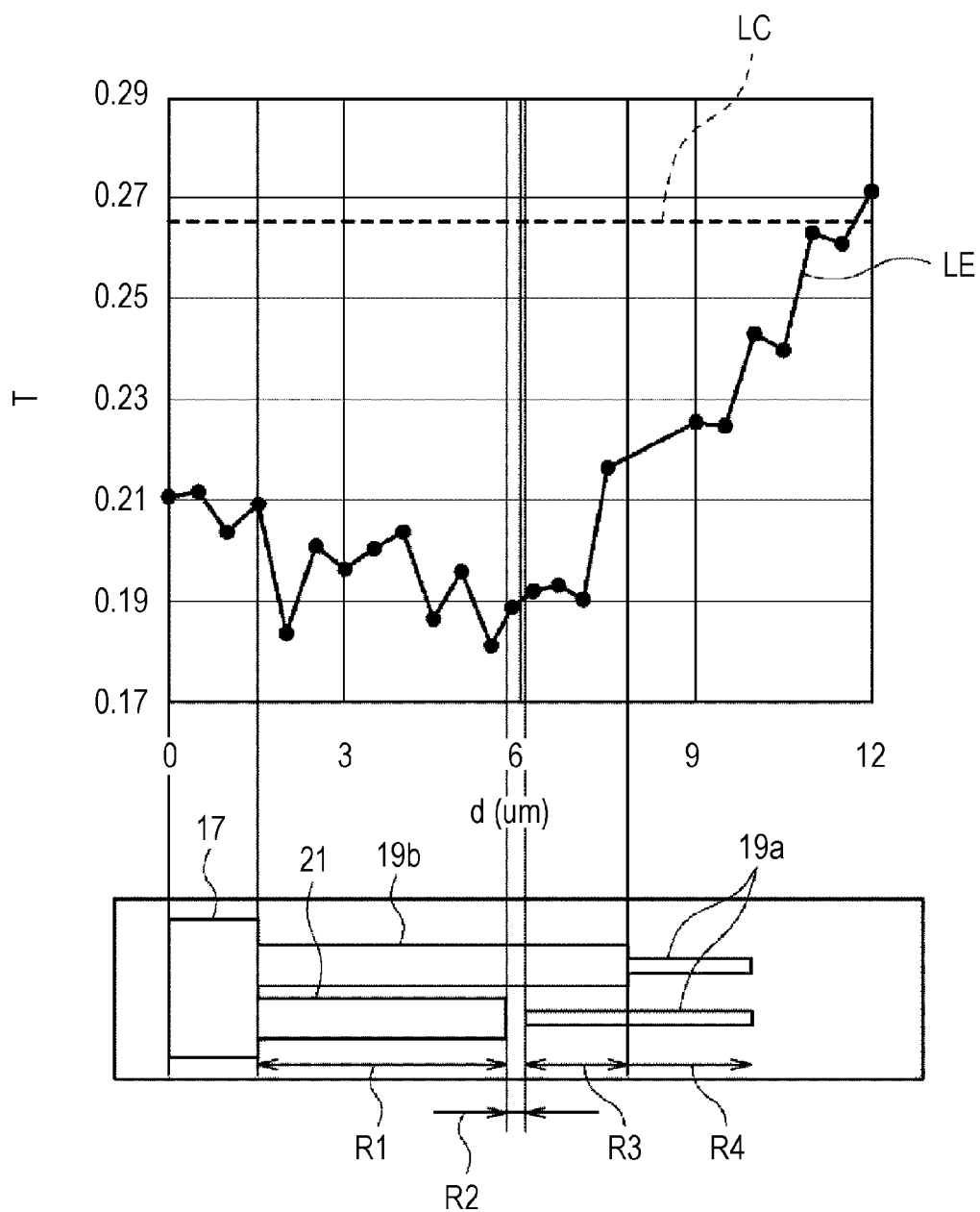
FIG. 7A illustrates characteristics of a resonator in which a material of a cavity layer is Si.
Figure 7B:
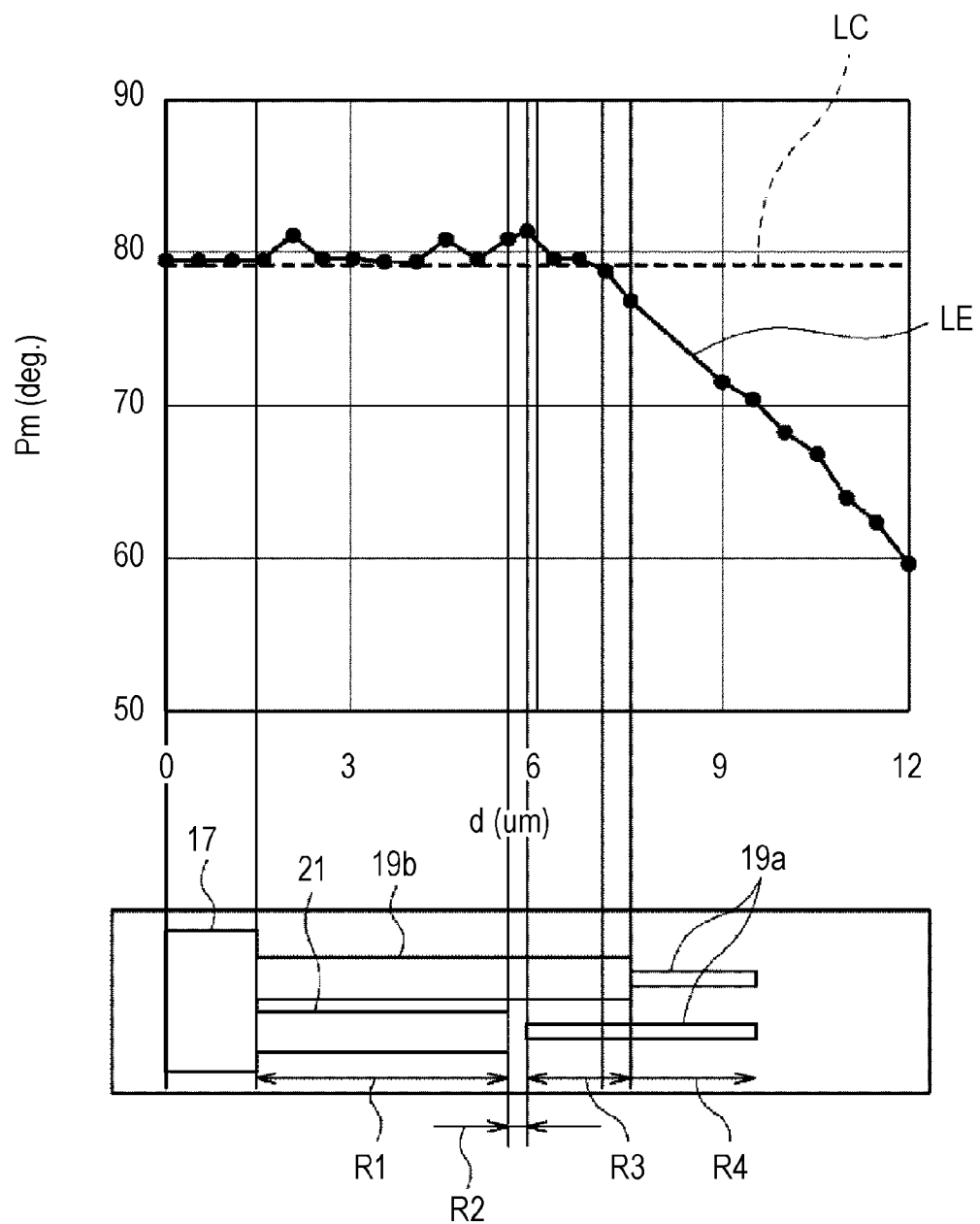
FIG. 7B illustrates other characteristics of the resonator in FIG. 7A.

FIGS. 7A and 7B illustrate the characteristics of the resonator 7 in which the material of the cavity layer 37 is Si.

In graphs in upper zones of those drawings, the horizontal axis indicates the inward extension amount d. In the upper zone of FIG. 7A, the vertical axis indicates the index T. In the upper zone of FIG. 7B, the vertical axis indicates the phase average value Pm. Lower zones of FIGS. 7A and 7B each schematically illustrate the shape of the IDT electrode 11. In those drawings, a position along the horizontal axis in the upper zone and a horizontal position in the IDT electrode 11 in the lower zone correspond to each other. For instance, 0 μm in the upper zone corresponds to the outer edge of the busbar 17 in the lower zone. Moreover, 1.5 μm in the upper zone corresponds to the inner edge of the busbar 17 in the lower zone.

In FIGS. 7A and 7B, a line LE represents characteristics of Example. A line LC represents characteristics of Comparative Example. In other words, the line LC represents a value of the index T or the phase average value Pm regardless of the position along the horizontal axis when the inward extension amount d takes a minus value (more exactly, −1 μm).

In FIG. 7A, change in the index T with respect to change in the inward extension amount d is as follows. When the inward extension amount d is 0, the index T is smaller than that in Comparative Example. As the inward extension amount d increases from 0 μm, the index T gradually reduces substantially. When the edge 33a of the cavity 33 comes close to the gap region R2, the index T stops further reduction. Thereafter, the index T starts to increase a little before the edge 33a reaches the central region R4. As the edge 33a enters the central region R4 and the inward extension amount d further increases, the index T becomes greater than that in Comparative Example.

A relationship between the range where the edge 33a of the cavity 33 is located and the magnitude of the index T is as follows. When the edge 33a is located within the range (R1+R2+R3) from the outer edge of the busbar 17 to the edge of the central region R4, the index T is reduced in comparison with that in Comparative Example. Moreover, when the edge 33a is located within the above-mentioned range, the magnitude of the index T is substantially equal to or smaller than that when the inward extension amount d is 0 μm. More exactly speaking, when the edge 33a is located within the range of R1+R2, the magnitude of the index T is equal to or smaller than that when the inward extension amount d is 0 μm. When the edge 33a is located within the range of the gap region R2 and/or the surroundings thereof, the index T is minimized. The relevant range can be given as, for example, a range having a width of about 10 times the width of the gap region R2 with the gap region R2 being at a center. In another example, the above-mentioned range can be given as a range within the dummy region R1, the range being adjacent to the gap region R2 and having a width of about 5 times the width of the gap region R2.

In FIG. 7B, change in the phase average value Pm with respect to change in the inward extension amount d is as follows. When the inward extension amount d is 0, the phase average value Pm is substantially equal to (slightly greater than) that in Comparative Example. Even when the inward extension amount d increases from 0 μm, the phase average value Pm is not greatly changed and is maintained in a state substantially equal to the phase average value Pm in Comparative Example. Thereafter, the phase average value Pm starts to decrease a little before the edge 33a of the cavity 33 reaches the central region R4. Then, the phase average value Pm becomes smaller than that in Comparative Example.

A relationship between the range where the edge 33a of the cavity 33 is located and the magnitude of the phase average value Pm is as follows. When the edge 33a is located within the range (R1+R2+R3) from the outer edge of the busbar 17 to the edge of the central region R4, the phase average value Pm is substantially equal to or greater than that in Comparative Example. When the edge 33a is located within the range of R1+R2, the phase average value Pm is greater than that in Comparative Example.

($SiO_2$)

Figure 8A:
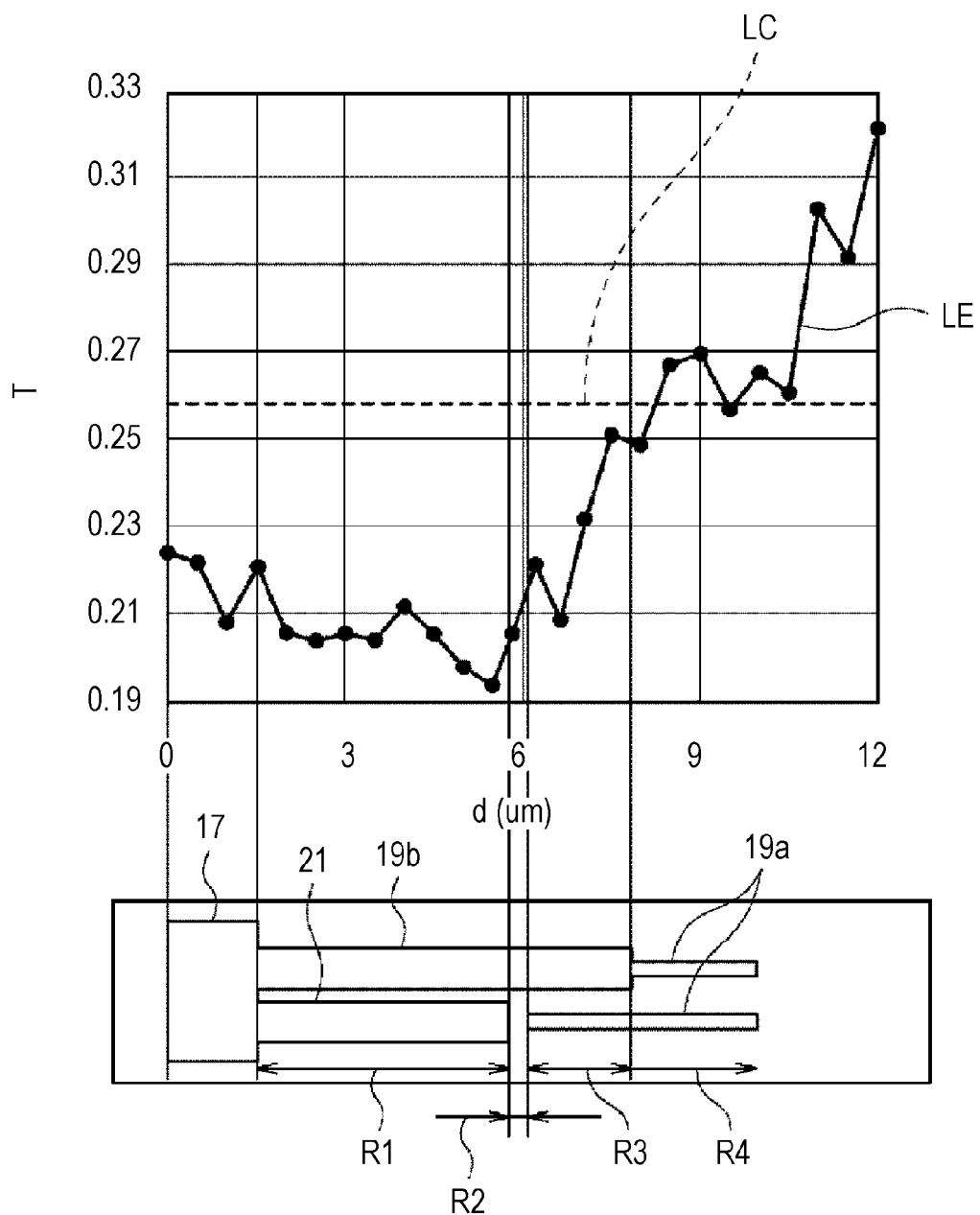
FIG. 8A illustrates characteristics of a resonator in which the cavity layer contains Si and $SiO_2$.
Figure 8B:
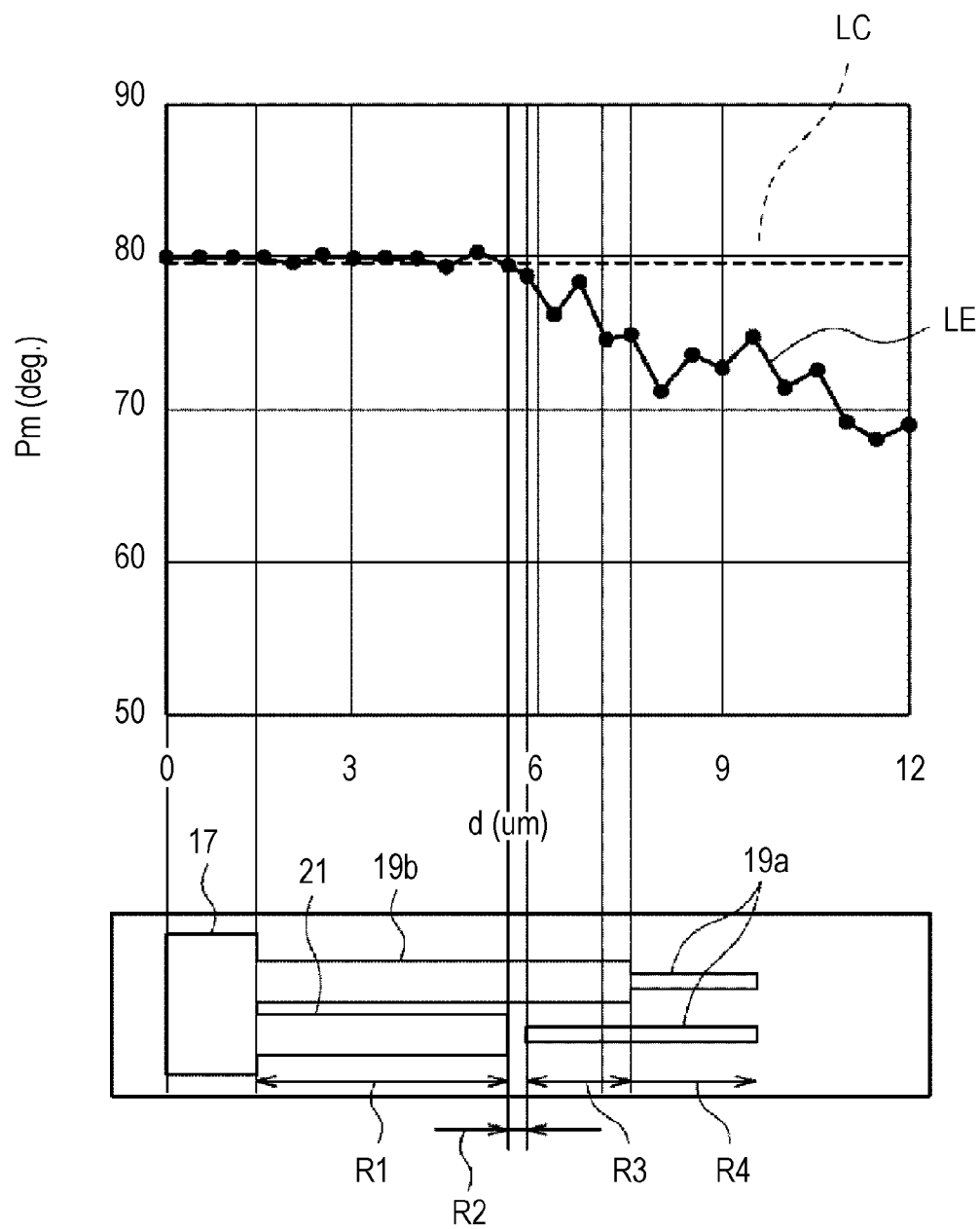
FIG. 8B illustrates other characteristics of the resonator in FIG. 8A.

FIGS. 8A and 8B illustrate the characteristics of the resonator 7 in which the cavity layer 37 includes the first layer 37a made of Si and the second layer 37b made of SiO$_2$. FIGS. 8A and 8B are analogous to FIGS. 7A and 7B, respectively. The thickness of the second layer 37b is 0.1 µm.

In FIG. 8A, change in the index T with respect to change in the inward extension amount d is substantially the same as and/or similar to that in FIG. 7A. Comparing with the case of FIG. 7A, however, after the edge 33a of the cavity 33 comes close to the gap region R2 and the index T stops further reduction, the index T starts to increase at earlier timing.

A relationship between the range where the edge 33a of the cavity 33 is located and the magnitude of the index T is as follows. When the edge 33a is located within the range (R1+R2+R3) from the outer edge of the busbar 17 to the edge of the central region R4, the index T is reduced in comparison with that in Comparative Example as in FIG. 7A. However, unlike the case of FIG. 7A, when the edge 33a is located within the above-mentioned range, the magnitude of the index T is not smaller than that when the inward extension amount d is 0 µm. Moreover, when the edge 33a is located within the range of R1+R2, the magnitude of the index T is equal to or smaller than that when the inward extension amount d is 0 µm as in FIG. 7A. When the edge 33a is located within the range of the gap region R2 and/or the surroundings thereof, the index T is minimized as in FIG. 7A. The relevant range can be given as, for example, the range within the dummy region R1, that range being adjacent to the gap region R2 and having the width of about 5 times the width of the gap region R2.

In FIG. 8B, change in the phase average value Pm with respect to change in the inward extension amount d is substantially the same as and/or similar to that in FIG. 7B. Comparing with FIG. 7A, however, the phase average value Pm starts to decrease at earlier timing.

A relationship between the range where the edge 33a of the cavity 33 is located and the magnitude of the phase average value Pm is as follows. When the edge 33a is located within the range (R1+R2) from the outer edge of the busbar 17 to the edge of the intersection region R6, the phase average value Pm is substantially equal to that in Comparative Example.

(Low Resistance Layer)

Figure 9A:
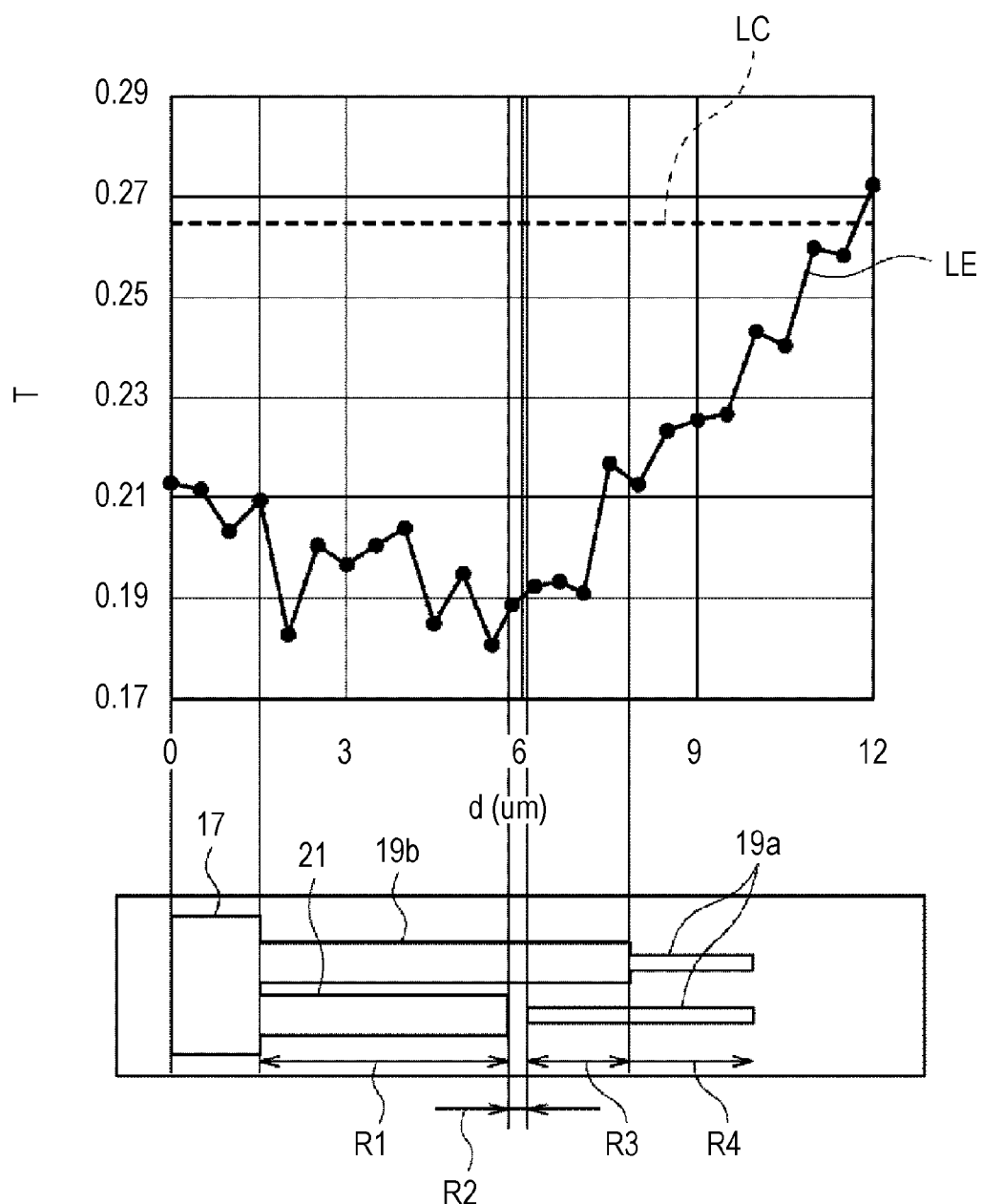
FIG. 9A illustrates characteristics of a resonator in which the cavity layer contains Si and a low resistance layer.
Figure 9B:
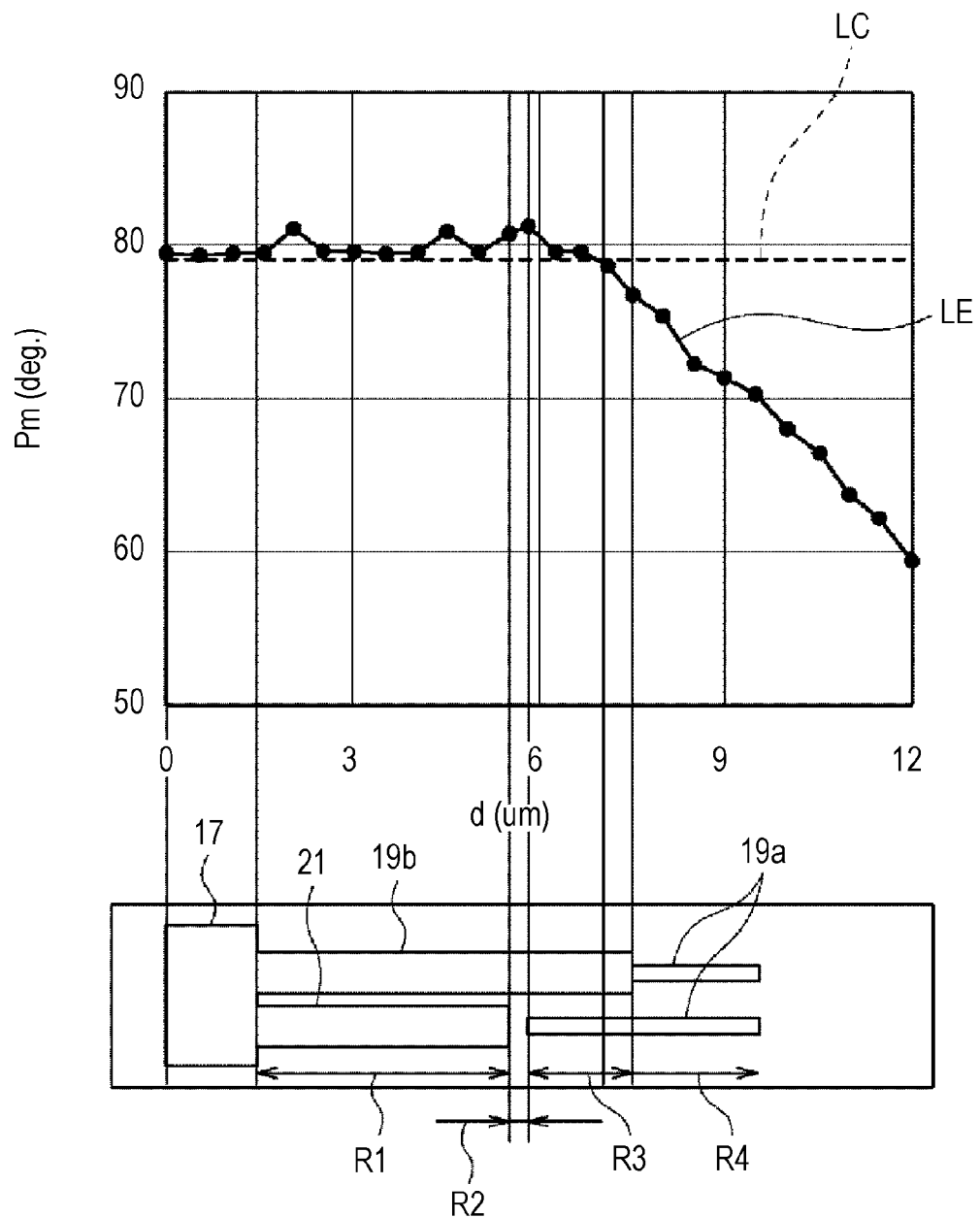
FIG. 9B illustrates other characteristics of the resonator in FIG. 9A.

FIGS. 9A and 9B illustrate the characteristics of the resonator 7 in which the cavity layer 37 includes the first layer 37a made of Si and the second layer 37b made of the low resistance layer. FIGS. 9A and 9B are analogous to FIGS. 7A and 7B, respectively. The thickness of the second layer 37b is 2 nm. The resistivity of the second layer 37b is 2.5 Ω·cm at 5500 MHz. Thus, the sheet resistance of the second layer 37b is 1.25×10$^7$Ω. The sheet resistance of the second layer 37b is adjusted by carrying out predetermined treatment on the upper surface of the first layer 37a, and the density and the elastic modulus of the first layer 37a are substantially equal to those of Si.

In FIG. 9A, change in the index T with respect to change in the inward extension amount d and a relationship between the range where the edge 33a of the cavity 33 is located and the magnitude of the index T are substantially the same as and/or similar to those in FIG. 7A. In FIG. 9B, change in the phase average value Pm with respect to change in the inward extension amount d and a relationship between the range where the edge 33a of the cavity 33 is located and the magnitude of the phase average value Pm are substantially the same as and/or similar to those in FIG. 7B.

(AlN)

Figure 10A:
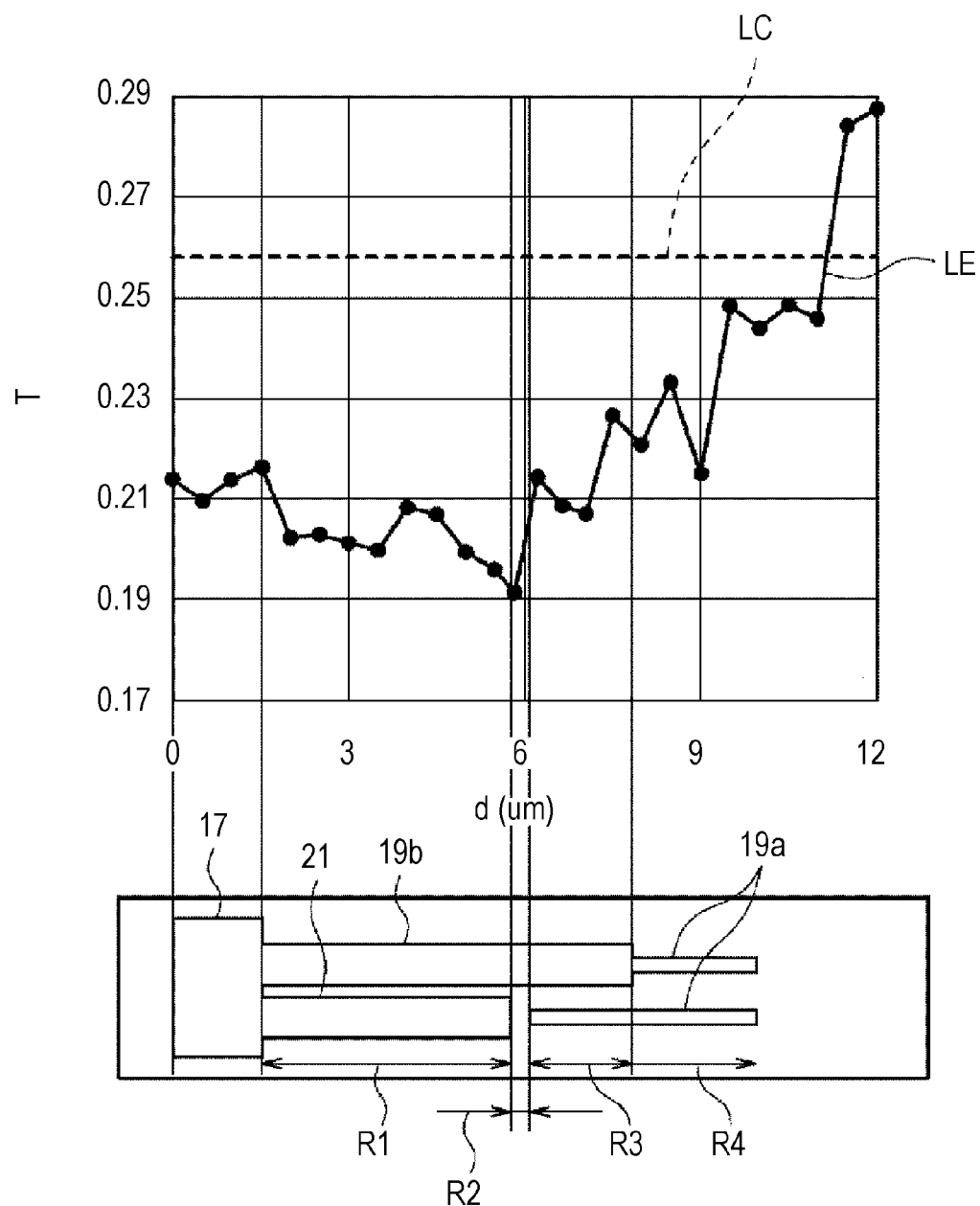
FIG. 10A illustrates characteristics of a resonator in which the cavity layer contains Si and AlN.
Figure 10B:
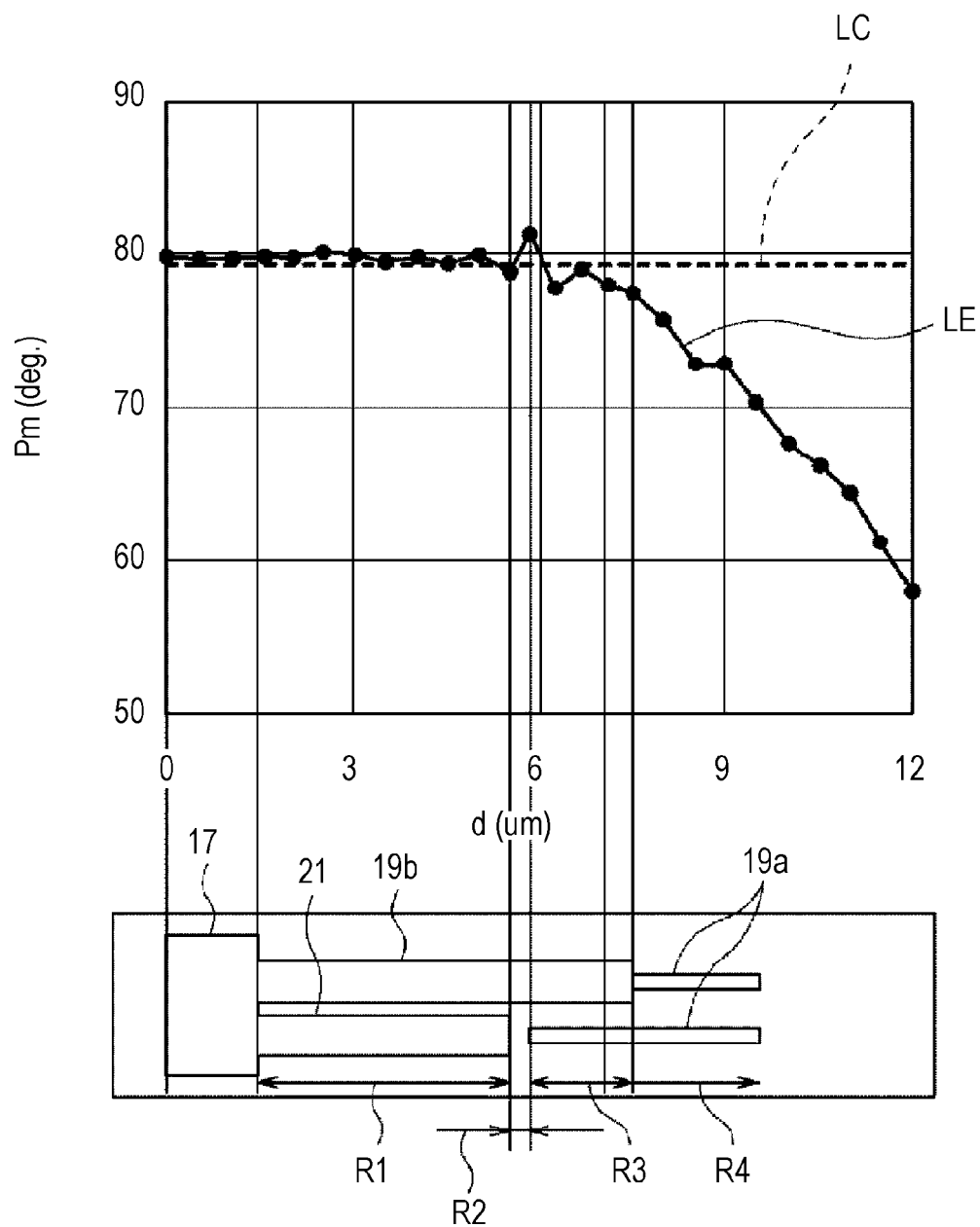
FIG. 10B illustrates other characteristics of the resonator in FIG. 10A.

FIGS. 10A and 10B illustrate the characteristics of the resonator 7 in which the cavity layer 37 includes the first layer 37a made of Si and the second layer 37b made of AlN. FIGS. 10A and 10B are analogous to FIGS. 7A and 7B, respectively. The thickness of the second layer 37b is 0.1 µm.

In FIG. 10A, change in the index T with respect to change in the inward extension amount d and a relationship between the range where the edge 33a of the cavity 33 is located and the magnitude of the index T are substantially the same as and/or similar to those in FIG. 8A. However, the range where the index T is minimized is given as not only the range described above with reference to FIG. 8A (namely, the range within the dummy region R1, that range being adjacent to the gap region R2 and having the width of about 5 times the width of the gap region R2), but also a range obtained by adding, to the above-mentioned range, a half of the gap region R2 on a side closer to the dummy region R1. In FIG. 10B, change in the phase average value Pm with respect to change in the inward extension amount d and a relationship between the range where the edge 33a of the cavity 33 is located and the magnitude of the phase average value Pm are substantially the same as and/or similar to those in FIG. 8B.

(HfO$_2$)

Figure 11A:
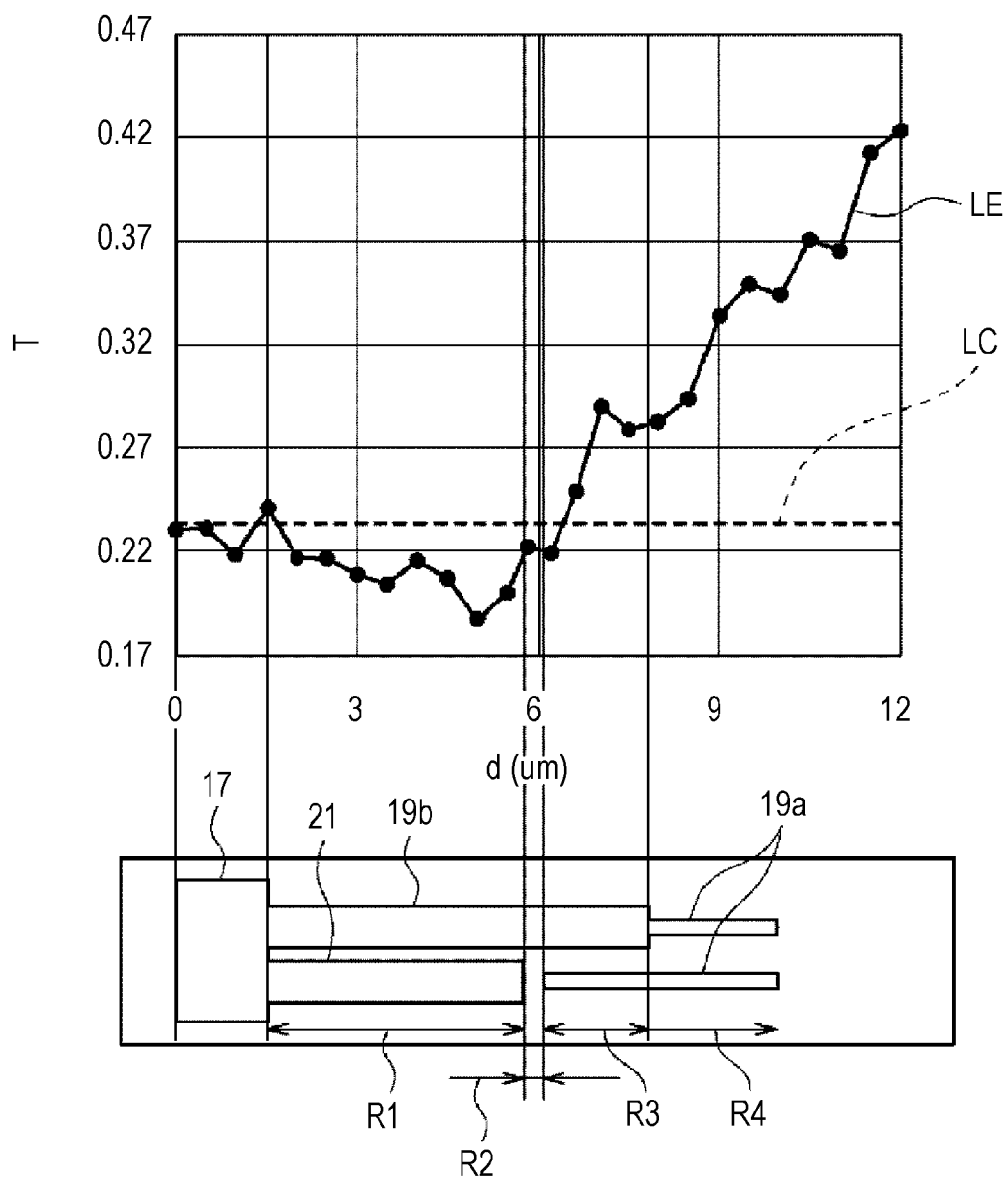
FIG. 11A illustrates characteristics of a resonator in which the cavity layer contains Si and $HfO_2$.
Figure 11B:
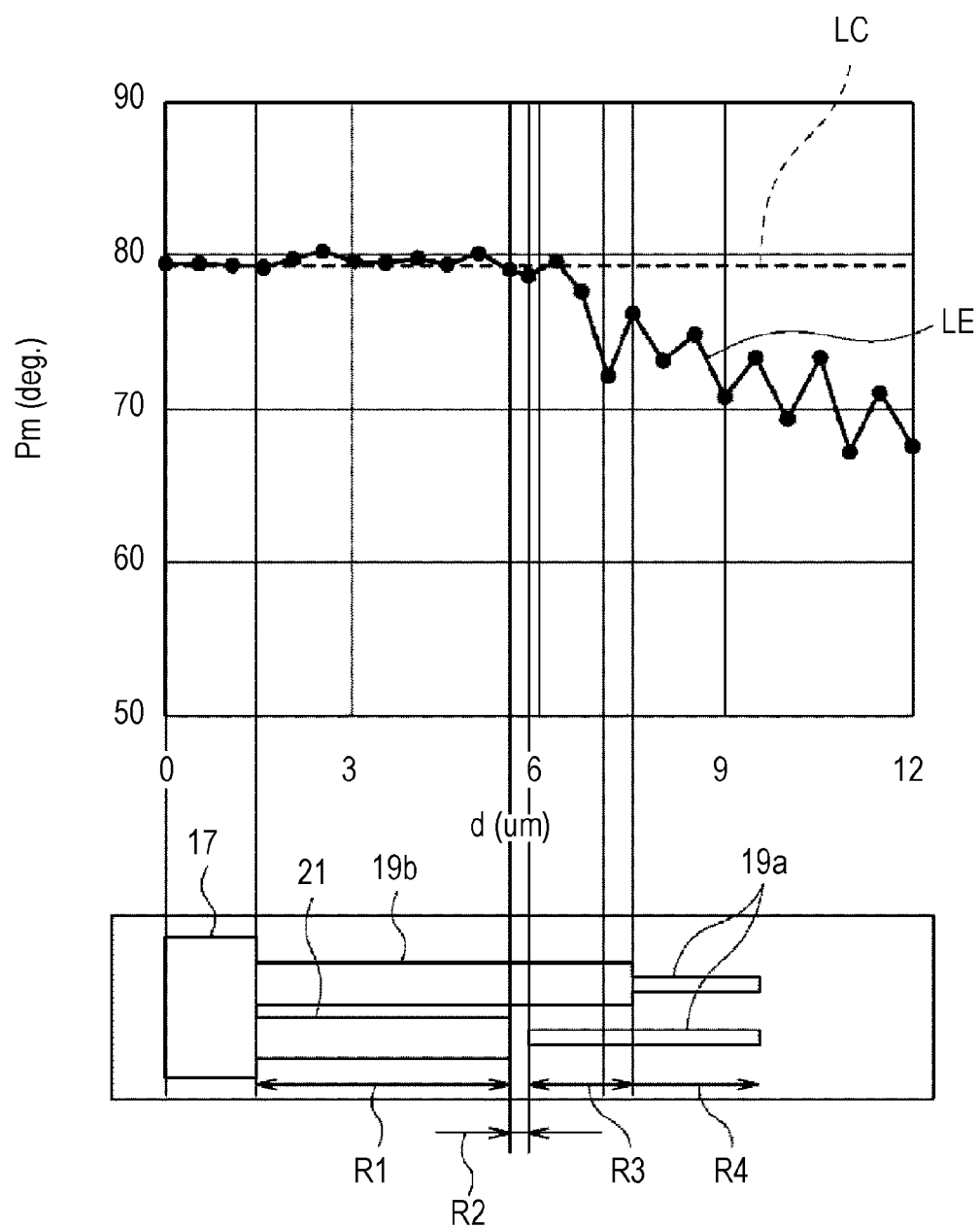
FIG. 11B illustrates other characteristics of the resonator in FIG. 11A.

FIGS. 11A and 11B illustrate the characteristics of the resonator 7 in which the cavity layer 37 includes the first layer 37a made of Si and the second layer 37b made of HfO$_2$. FIGS. 11A and 11B are analogous to FIGS. 7A and 7B, respectively. The thickness of the second layer 37b is 0.1 µm.

In FIG. 11A, change in the index T with respect to change in the inward extension amount d is substantially the same as and/or similar to that in FIG. 8A. However, the index T when the inward extension amount d is 0 is substantially equal to that in Comparative Example unlike the above-described Examples. Furthermore, when the index T starts to increase after stopping further reduction, the index T reaches a value equal to that of the index T in Comparative Example at earlier timing than in the above-described Examples.

A relationship between the range where the edge 33a of the cavity 33 is located and the magnitude of the index T is as follows. When the edge 33a is located within the range (R1+R2) from the outer edge of the busbar 17 to the edge of the intersection region R6, the index T is substantially equal to or smaller than that in Comparative Example. Moreover, when the edge 33a is located within the above-mentioned range, the magnitude of the index T is substantially equal to or smaller than that when the inward extension amount d is 0 µm. When the edge 33a is located within the range of the gap region R2 and/or the surroundings thereof, the index T is minimized as in FIG. 7A. The relevant range can be given as, for example, a range such as described with reference to FIG. 8A (namely, the range within the dummy region R1, that range being adjacent to the gap region R2 and having the width of about 5 times the width of the gap region R2).

In FIG. 11B, change in the phase average value Pm with respect to change in the inward extension amount d and a relationship between the range where the edge 33a of the cavity 33 is located and the magnitude of the phase average value Pm are substantially the same as and/or similar to those in FIG. 8B.

(Comparison Among Materials of Cavity Layer)

The characteristics obtained for the individual materials of the cavity layer 37, illustrated in FIGS. 7A to 11B, are compared among the materials. Looking at the index T of the second layer 37b made of HfO$_2$ (FIG. 11A), a reduction amount thereof relative to the index T in Comparative Example is smaller than that in the other Examples. Thus, in the case of $HfO_2$, the effect of reducing the spurious components is relatively small. $HfO_2$ is the material with a relatively high density. For instance, the densities of LN and LT are 4 g/cm³ or more and 8 g/cm³ or less. The density of $HfO_2$ is 9 g/cm³ or more and 11 g/cm³ or less. The densities of Si, $SiO_2$, and AlN are 2 g/cm³ or more and 4 g/cm³ or less. Accordingly, the material forming the upper surface of the support 29 (e.g., the upper surface of the whole cavity layer 37 or the second layer 37b) may be, for example, the material with a smaller density than that of the material of the piezoelectric layer 31.

Si (FIG. 7A) and $SiO_2$ (FIG. 8A) have relatively close densities (2 g/cm³ or more and 3 g/cm³ or less). However, when the material of the cavity layer 37 is Si, the value of the index T itself is smaller, the reduction amount thereof relative to the index T in Comparative Example is greater, and the range of the value of the inward extension amount d where the index T can be reduced is wider. The reason may reside in that the acoustic velocity in $SiO_2$ is relatively low and the acoustic waves leaked from the central region R4 tend to concentrate in portions near the edges 33a of the cavity layer 37. The acoustic velocity (expressed by the root of a value resulting from dividing an elastic modulus by a density) in $SiO_2$ is 5000 m/s or higher and 6000 m/s or lower, and the acoustic velocity in Si is 7000 m/s or higher and 9000 m/s or lower. Accordingly, the material forming the upper surface of the support 29 (e.g., the upper surface of the whole cavity layer 37 or the second layer 37b) may be, for example, a material in which the acoustic velocity of 7000 m/s or higher.

(Width of Wider Portion)

In Examples illustrated in FIGS. 7A to 11B, the Duty of the wider portion 19b is set to 0.60. Characteristics obtained with simulation calculations for the cases of setting the Duty of the wider portion 19b to values different from 0.60 will be described below. Other conditions than the Duty of the wider portion 19b are the same as and/or similar to those in the case of FIG. 7A. For instance, the cavity layer 37 is entirely made of Si.

Figure 12A:
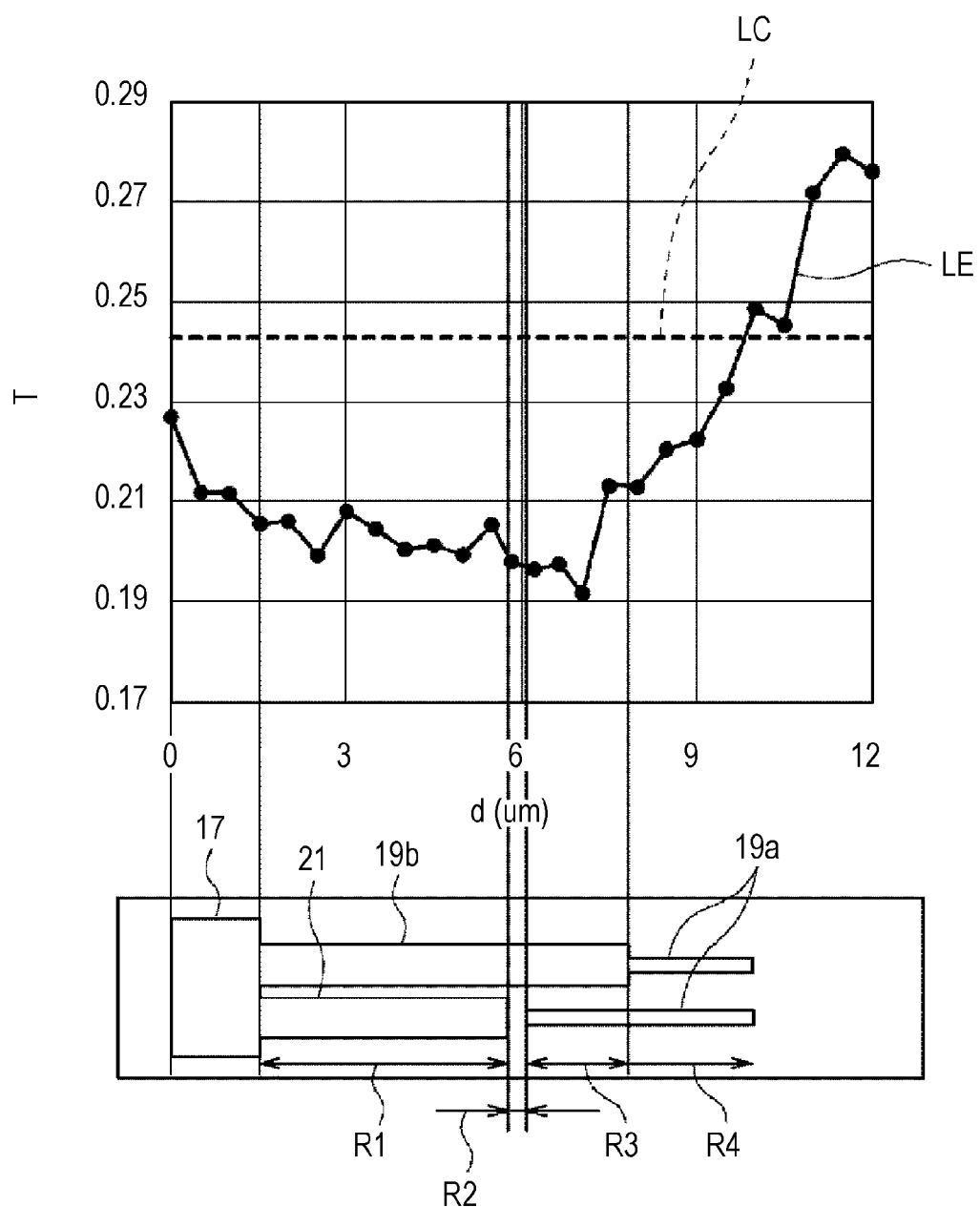
FIG. 12A illustrates characteristics of a resonator in which Duty of a wider portion is 0.70.
Figure 12B:
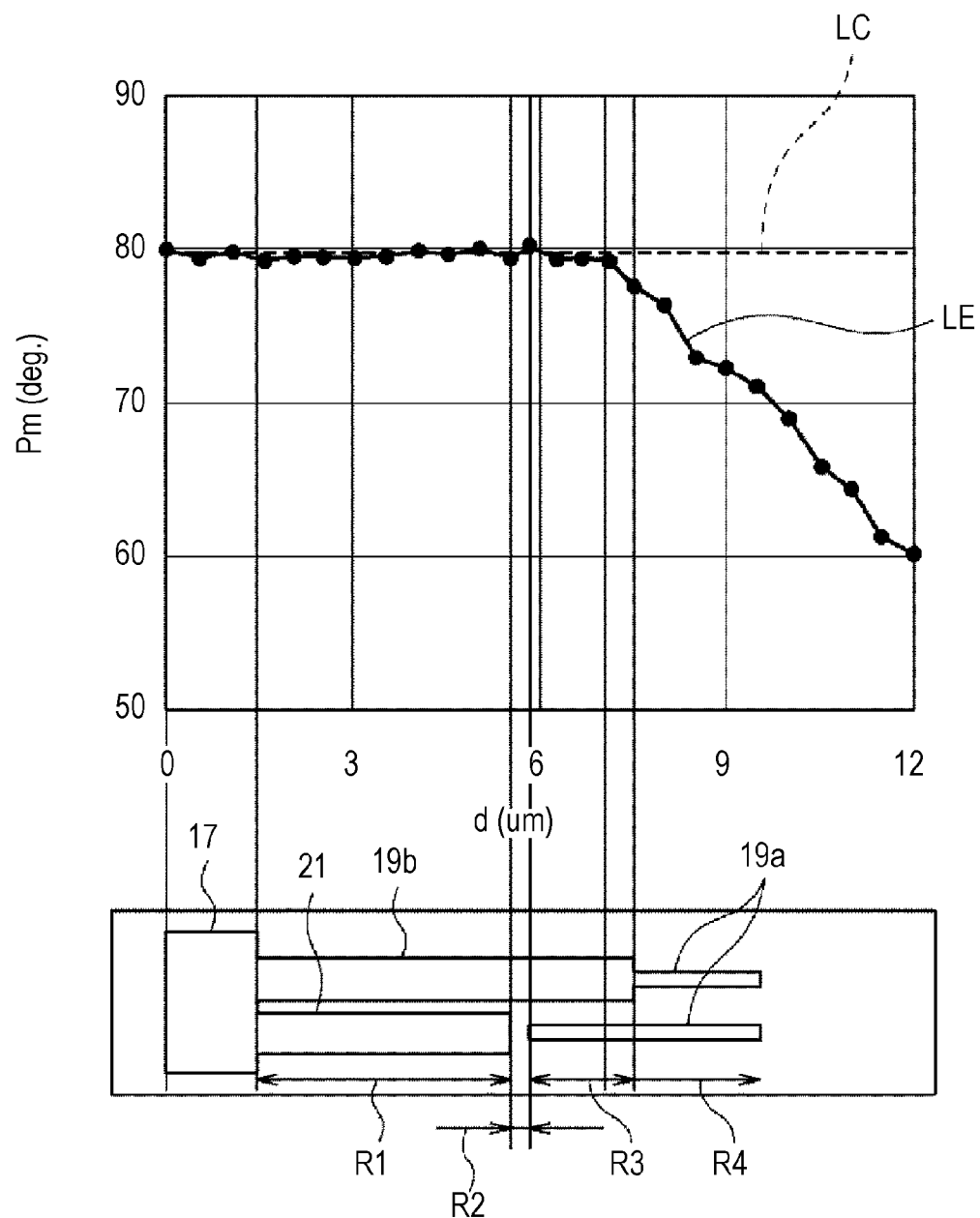
FIG. 12B illustrates other characteristics of the resonator in FIG. 12A.
Figure 13B:
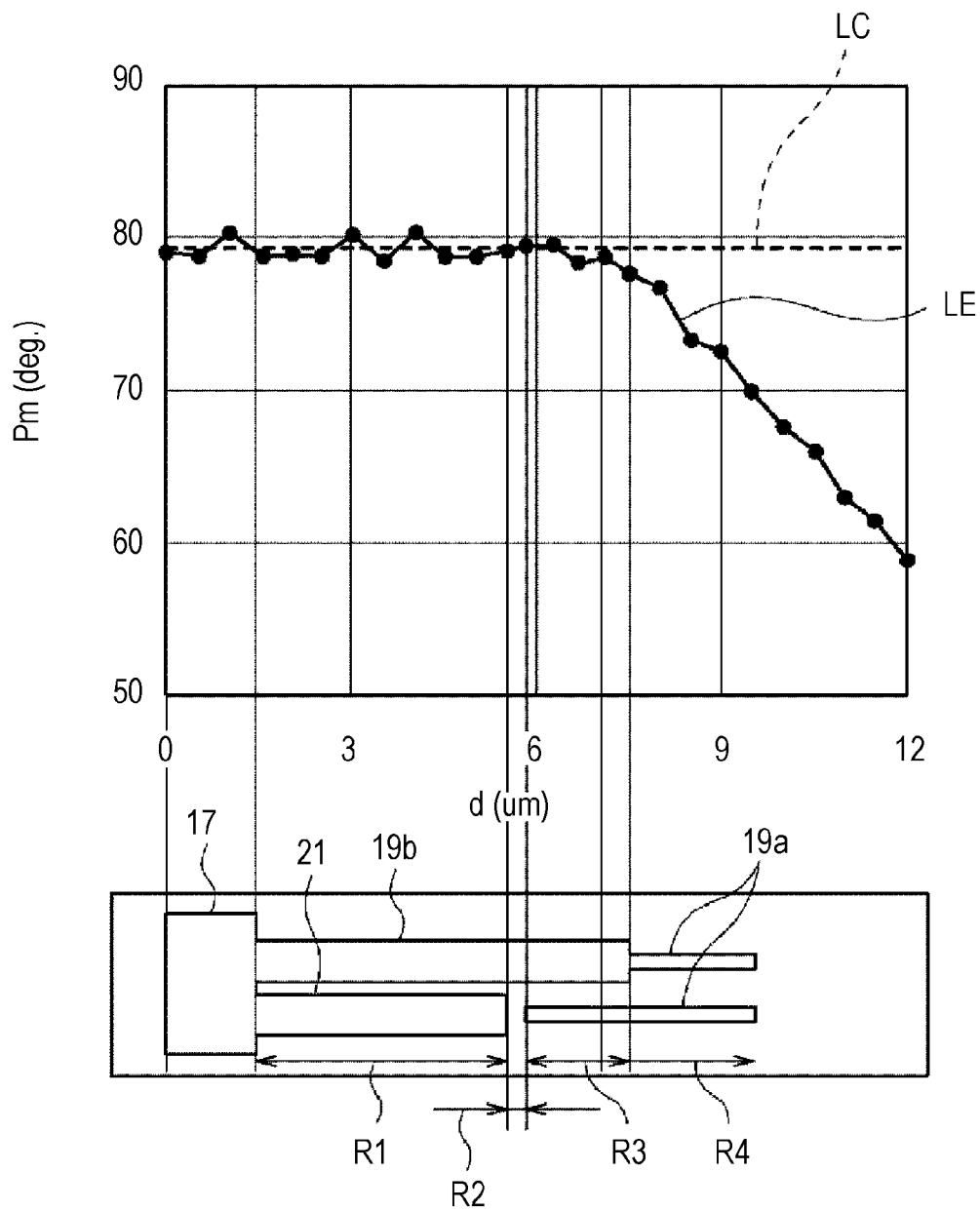
FIG. 13B illustrates other characteristics of the resonator in FIG. 13A.

FIGS. 12A and 12B illustrate the characteristics of the resonator 7 in which the wider portion 19b has the Duty of 0.70. FIGS. 12A and 12B are analogous to FIGS. 7A and 7B, respectively. FIGS. 13A and 13B illustrate the characteristics of the resonator 7 in which the wider portion 19b has the Duty of 0.80. FIGS. 13A and 13B are analogous to FIGS. 7A and 7B, respectively.

As seen from those drawings, tendencies of both the index T and the phase average value Pm are the same as and/or similar to those in FIGS. 7A and 7B. However, the position of the edge 33a of the cavity 33 at which the index T is minimized is located at a position in the dummy region R1 adjacent to the gap region R2 in FIG. 7A, whereas the position of the edge 33a at which the index T is minimized is located within the end region R3 in FIG. 12A. In FIG. 13A, assuming a position at which the inward extension amount d is 3 µm to be a singular point, the position of the edge 33a at which the index T is minimized is located within the wider portion 19b. The reason may reside in that the Duty of the wider portion 19b increases and hence the wider portion 19b gives a greater influence upon the acoustic velocity in the end region R3. In addition, comparing the magnitude of the index T among FIG. 7A, FIG. 12A, and FIG. 13A, the magnitude is minimum in FIG. 7A.

(Width of Busbar)

The characteristics of the resonator 7 were determined with simulation calculations while the width of the busbar 17 was changed. As a result, it was confirmed that the effect of reducing the spurious components in the transverse mode can be obtained regardless of the width of the busbar 17. Details are as follows.

Figure 14A:
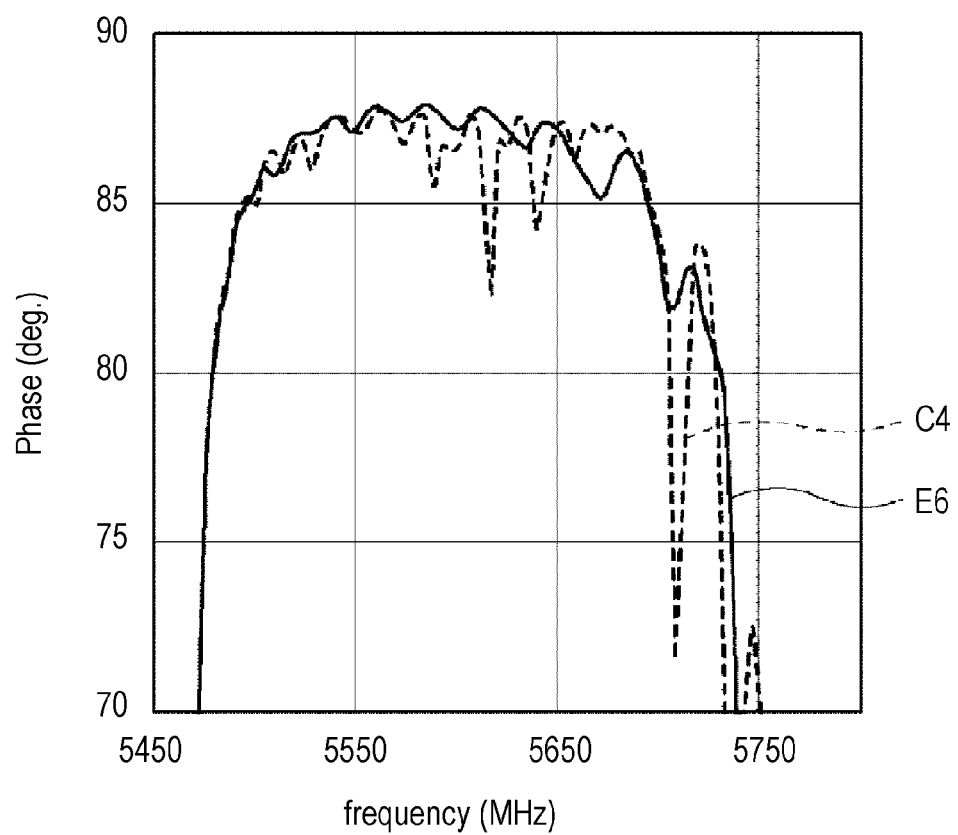
FIG. 14A is a graph illustrating characteristics of resonators according to Comparative Example and Example in which busbars have different widths.
Figure 14B:
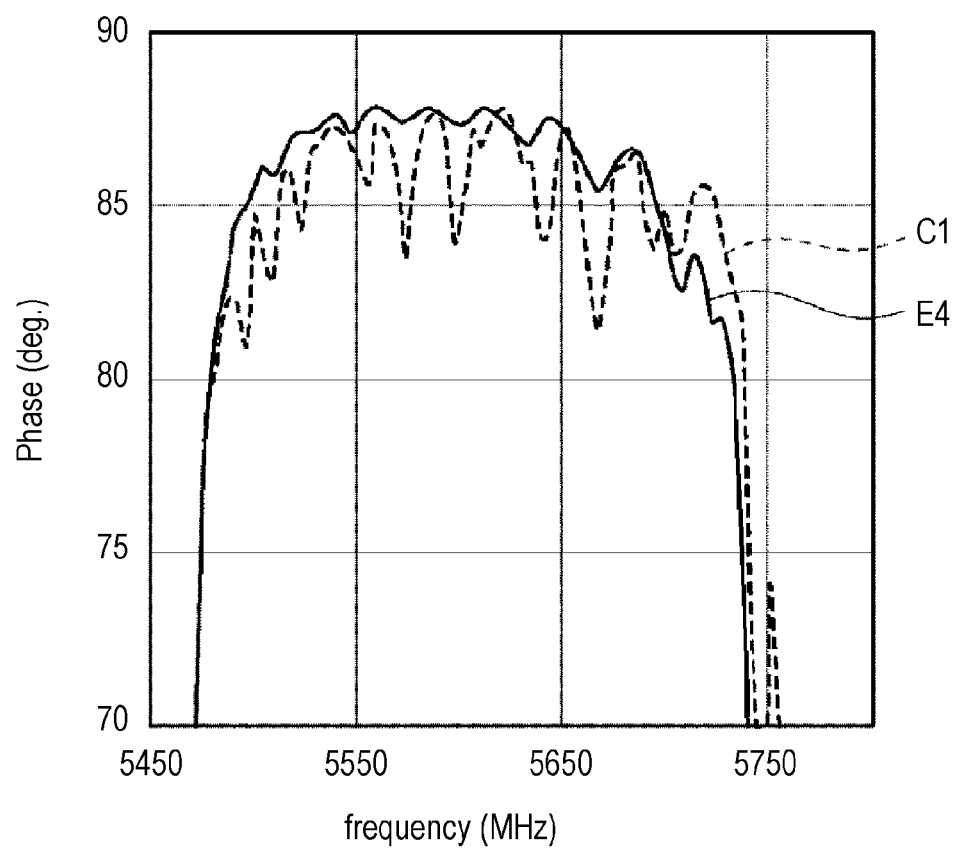
FIG. 14B is a graph illustrating other characteristics of the resonators in FIG. 14A.

FIG. 14B illustrates the characteristics of First Comparative Example C1 in FIG. 4A and Fourth Example E4 in FIG. 6B and is analogous to FIG. 4A. As described above, in First Comparative Example C1, the electrode finger 19 does not include the wider portion 19b, and the edge 33a of the cavity 33 is located outside the region where the IDT electrode 11 is disposed. In First Comparative Example C1 and Fourth Example E4, the width of the busbar 17 is 1.5 µm.

FIG. 14A illustrates characteristics of Fourth Comparative Example C4 and Sixth Example E6 and is analogous to FIG. 4A. In Fourth Comparative Example C4 and Sixth Example E6, the width of the busbar 17 is set to 0.3 µm. Other conditions in Fourth Comparative Example C4 are the same as and/or similar to those in First Comparative Example C1. Other conditions in Sixth Example E6 are the same as and/or similar to those in Fourth Example E4.

As understood from the above-mentioned drawings, with the configuration that the edge 33a of the cavity 33 is located in the region where the IDT electrode 11 is disposed and that the wider portion 19b is disposed in the electrode finger 19, the effect of reducing the spurious components in the transverse mode can be obtained without depending on the width of the busbar 17.

Figure 15A:
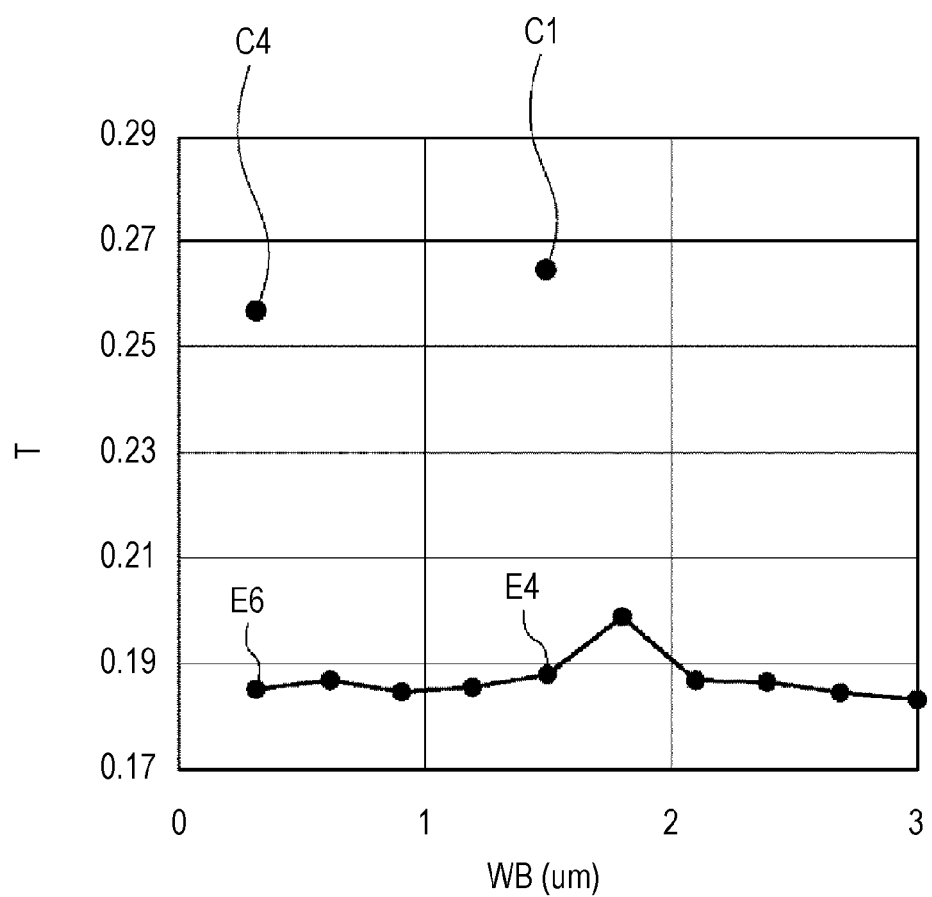
FIG. 15A is a graph illustrating change in characteristics of the resonators with respect to change in widths of the busbars.
Figure 15B:
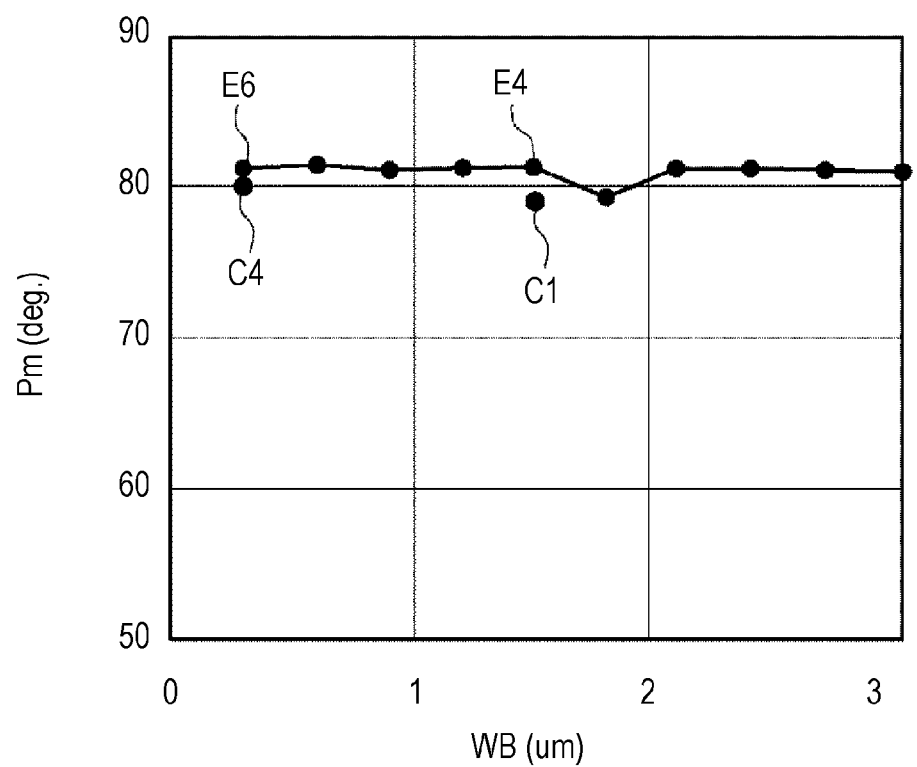
FIG. 15B is a graph illustrating other characteristics of the resonators in FIG. 15A.

FIGS. 15A and 15B are graphs each illustrating change in the characteristics of the resonator 7 with respect to change in the width of the busbar 17.

In those graphs, the horizontal axis BW indicates the width of the busbar 17. The vertical axis in FIG. 15A indicates the index T. The vertical axis in FIG. 15B indicates the phase average value Pm. A polygonal line in each graph represents the characteristics of Example. The graphs further indicate dots representing the characteristics of First Comparative Example C1, Fourth Example E4, Fourth Comparative Example C4, and Sixth Example E6 that are illustrated in FIGS. 14A and 14B. From those graphs as well, it is understood that the above-described effect does not depend on the width of the busbar 17.

As described above, the acoustic wave element 1 includes the support 29, the piezoelectric layer 31 on the support 29, and the IDT electrode 11 on the piezoelectric layer 31. The cavity 33 overlapping the IDT electrode 11 in the see-through plan view is formed between the piezoelectric layer 31 and the support 29. The IDT electrode 11 includes a first busbar and a second busbar (the busbars 17A and 17B), and further includes a plurality of first electrode fingers and a plurality of second electrode fingers (the electrode fingers 19A and 19B). The busbars 17A and 17B are opposite to each other in a direction (the D2 direction) intersecting a first direction (the D1 direction). The plurality of electrode fingers 19A extends from the busbar 17A toward the busbar 17B in parallel. The plurality of electrode fingers 19B extends from the busbar 17B toward the busbar 17A in parallel. The plurality of electrode fingers 19A and the plurality of electrode fingers 19B are arrayed alternately in the D1 direction. A region extending along an array of the plurality of electrode fingers 19A and the plurality of electrode fingers 19B in an intersection width over which the electrode finger 19A and the electrode finger 19B adjacent to each other overlap when viewing both the electrode fingers in the D1 direction is referred to as the intersection region R6. The intersection region R6 includes the central region R4, a first end region, and a second end region (namely, the two end regions R3). The central region R4 includes the center position between the two busbars 17. The end regions R3 are each a region spanning from the edge of the central region R4 on the side closer to the busbar 17 to the edge of the intersection region R6 on the side closer to the busbar 17. The cavity 33 overlaps the central region R4. The edge of the cavity 33 on the side closer to the busbar 17A is located within the range from the edge of the central region R4 on the side closer to the busbar 17A to the edge of the busbar 17A on the side opposite to the central region R4 (on the outer side). The plurality of electrode fingers 19A each include a first portion (the main portion 19a) and a second portion (the wider portion 19b). The main portion 19a is located in the central region R4. The wider portion 19b of the electrode finger 19A is located on the side closer to the busbar 17A or the busbar 17B (on the side closer to the busbar 17A in the embodiment) relative to the central region R4. A value of mass per unit length of the plurality of electrode fingers 19A above lower surfaces thereof in a second direction (the D2 direction) orthogonal to the D1 direction is greater in the wider portions 19b than in the main portions 19a.

Thus, as described above, the wider portions 19b can reduce the acoustic velocity in part of the region where the IDT electrode 11 is disposed, the part being located outside the central region R4. In addition, the support 29 can also reduce the acoustic velocity in part of the region where the IDT electrode 11 is disposed, the part being located outside the central region R4. With combination of those features, the spurious components in the transverse mode can be reduced.

The width of the second portion (the wider portion 19b) may be greater than the width of the first portion (the main portion 19a).

In the above case, the mass of the second portion per unit length can be increased with patterning of the conductive layer 5. As a result, the mass per unit length can be more simply increased than in a variation of increasing the mass of the second portion above the lower surface thereof per unit length in the D2 direction by another method (that variation may also be included in the scope of the technique according to the present disclosure). Hence the above case is further advantageous from the viewpoint of cost.

The wider portion 19b of the electrode finger 19A may be located on the side closer to the busbar 17A relative to the central region R4. In other words, the wider portion 19b may be located on the base side of the electrode finger 19.

In the above case, the spurious components in the transverse mode can be more easily reduced than, for example, a variation of forming the second portion (the wider portion 19b) on the tip side of the electrode finger 19 in addition to or instead of the base side of the electrode finger 19 (that variation may also be included in the scope of the technique according to the present disclosure). In the variation of forming the second portion on the tip side of the electrode finger 19 in addition to the base side thereof, characteristics on a higher frequency side than the anti-resonant frequency are improved by way of example.

The wider portion 19b of the electrode finger 19A may extend over the range (R1+R2+R3) from the busbar 17A to the edge of the central region R4 on the side closer to the busbar 17A.

In the above case, the effect of reducing the spurious components in the transverse mode is improved in comparison with, for example, a variation in which the wider portion 19b is located only in part of the range of R1+R2+R3 (that variation may also be included in the scope of the technique according to the present disclosure).

The edge 33a of the cavity 33 on the side closer to the busbar 17A may be located at any position within the range from the edge of the intersection region R6 on the side closer to the busbar 17A to the edge of the busbar 17A on the side opposite to the central region R4 (on the outer side).

As illustrated in FIGS. 7A to 11B, a probability of developing the effect of reducing the spurious components in the transverse mode is increased in comparison with the example in which the edge 33a is located in the end region R3. Moreover, a probability of making the phase average value Pm smaller is reduced. In addition, as understood from comparison among FIG. 7A, FIG. 7B, and FIGS. 12A to 13B, when the Duty of the wider portion 19b is set with intent to relatively increase the effect of reducing the spurious components in the transverse mode (FIGS. 7A and 7B), the spurious components in the transverse mode tend to be minimized when the edge 33a is located outside the intersection region R6.

The IDT electrode 11 may include a first dummy electrode and a second dummy electrode (the dummy electrodes 21A and 21B). The dummy electrode 21A protrudes from the busbar 17A toward the busbar 17B between adjacent two of the plurality of electrode fingers 19A, and the tip end of the dummy electrode 21A is arranged to face the tip end of a corresponding one of the plurality of electrode fingers 19B. The above description is similarly applied to the dummy electrode 21B as well. The edge 33a of the cavity 33 on the side closer to the busbar 17A may be located at any position within the range (R1+R2) from the tip ends of the plurality of dummy electrodes 21A to the edge of the busbar 17A on the side opposite to the central region R4 (on the outer side).

In the above case, for example, the above-described effect is further improved. In other words, the probability of developing the effect of reducing the spurious components in the transverse mode is increased. Moreover, the probability of making the phase average value Pm smaller is reduced. When the Duty of the wider portion 19b is set with intent to relatively increase the effect of reducing the spurious components in the transverse mode, the spurious components in the transverse mode are more easily minimized.

The edge 33a of the cavity 33 on the side closer to the busbar 17A may be located at any position within the range (R1+R2+R3) from the edge of the central region R4 on the side closer to the busbar 17A to the edge of the busbar 17A on the side closer to the central region R4 (on the inner side).

In the above case, as described before by way of example, since the index T tends to decrease as the inward extension amount d increases from 0 μm, the spurious components in the transverse mode are more easily minimized.

The material, the cut angles, and the thickness of the piezoelectric layer 31 may be set to satisfy a relationship with which an amplitude of the Lamb wave in the A1 mode among the acoustic waves excited by the IDT electrode 11 is maximized. In other words, the element 1 may utilize the Lamb wave in the A1 mode.

In the above case, as described before by way of example, a higher frequency is more easily obtained with respect to a value of the pitch p. Furthermore, since the upper surface of the support 29 gives a greater influence upon the boundary conditions of the acoustic wave, the above-described various advantageous effects are more easily developed.

The support 29 may include a layer (e.g., the whole of the support 29 itself, the cavity layer 37, or the second layer 37b) forming the upper surface of the support 29 and having a smaller density than the piezoelectric layer 31. Additionally and/or alternatively, the support 29 may include a layer (e.g., the whole of the support 29 itself, the cavity layer 37, or the second layer 37b) forming the upper surface of the support 29 and providing the acoustic velocity of 7000 m/s or higher.

In the above case, as described before by way of example, the effect of reducing the spurious components in the transverse mode can be improved. Furthermore, a range of the inward extension amount d where the effect of reducing the spurious components in the transverse mode is obtained can be widened.

Second Embodiment

The acoustic wave element may utilize the so-called piston mode. This case can also provide advantageous effects that are the same as and/or similar to those in the first embodiment. Details are as follows.

In the following, only different points from the first embodiment are described principally. Matters not specifically referred to below may be regarded as being the same as and/or similar to those in the first embodiment or may be inferred from the first embodiment. Moreover, components corresponding to those in the first embodiment are denoted by the same reference signs as those in the first embodiment in some cases for convenience of explanation even when there is a difference from the components in the first embodiment.

Figure 16A:
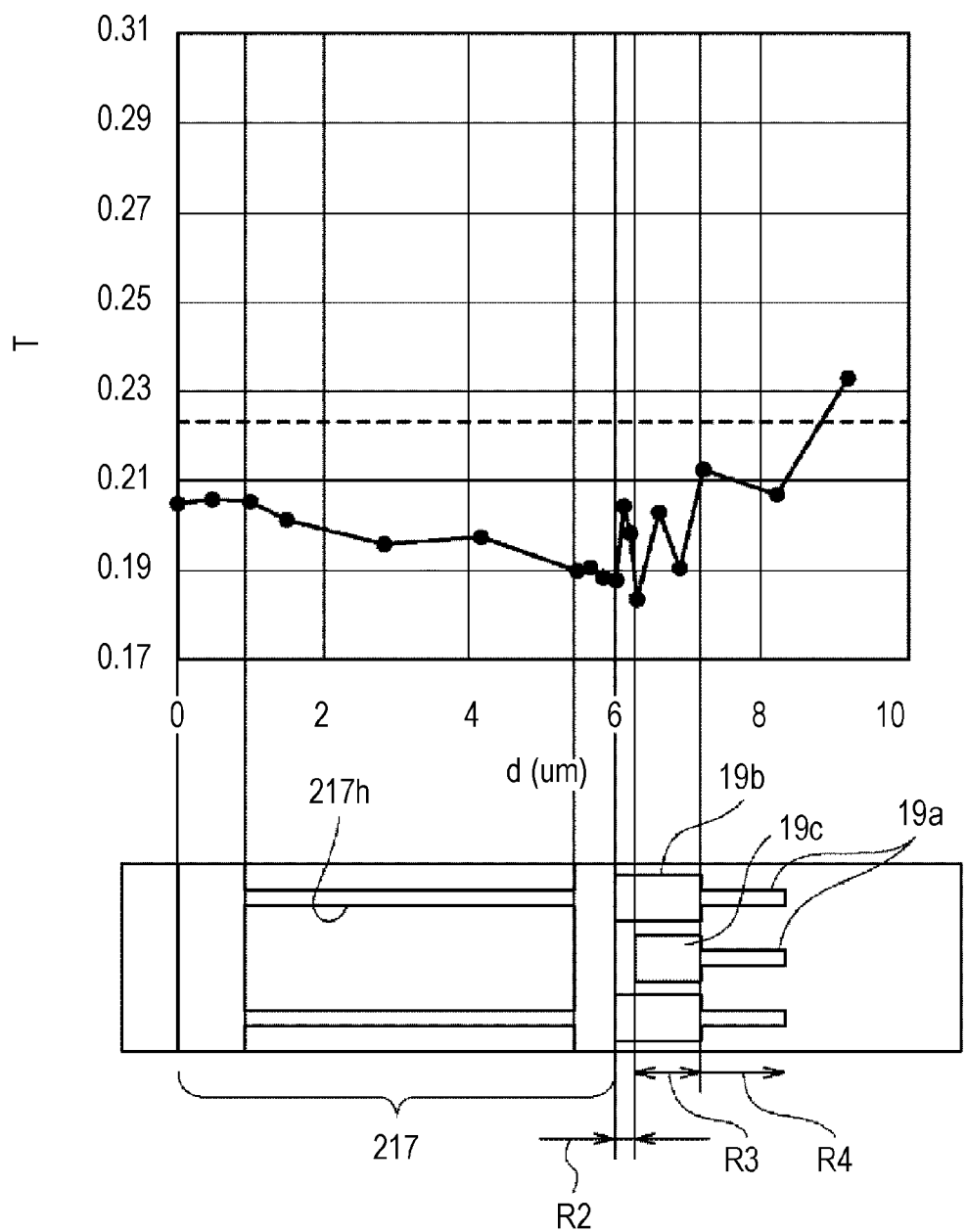
FIG. 16A illustrates characteristics of a resonator according to a second embodiment.
Figure 16B:
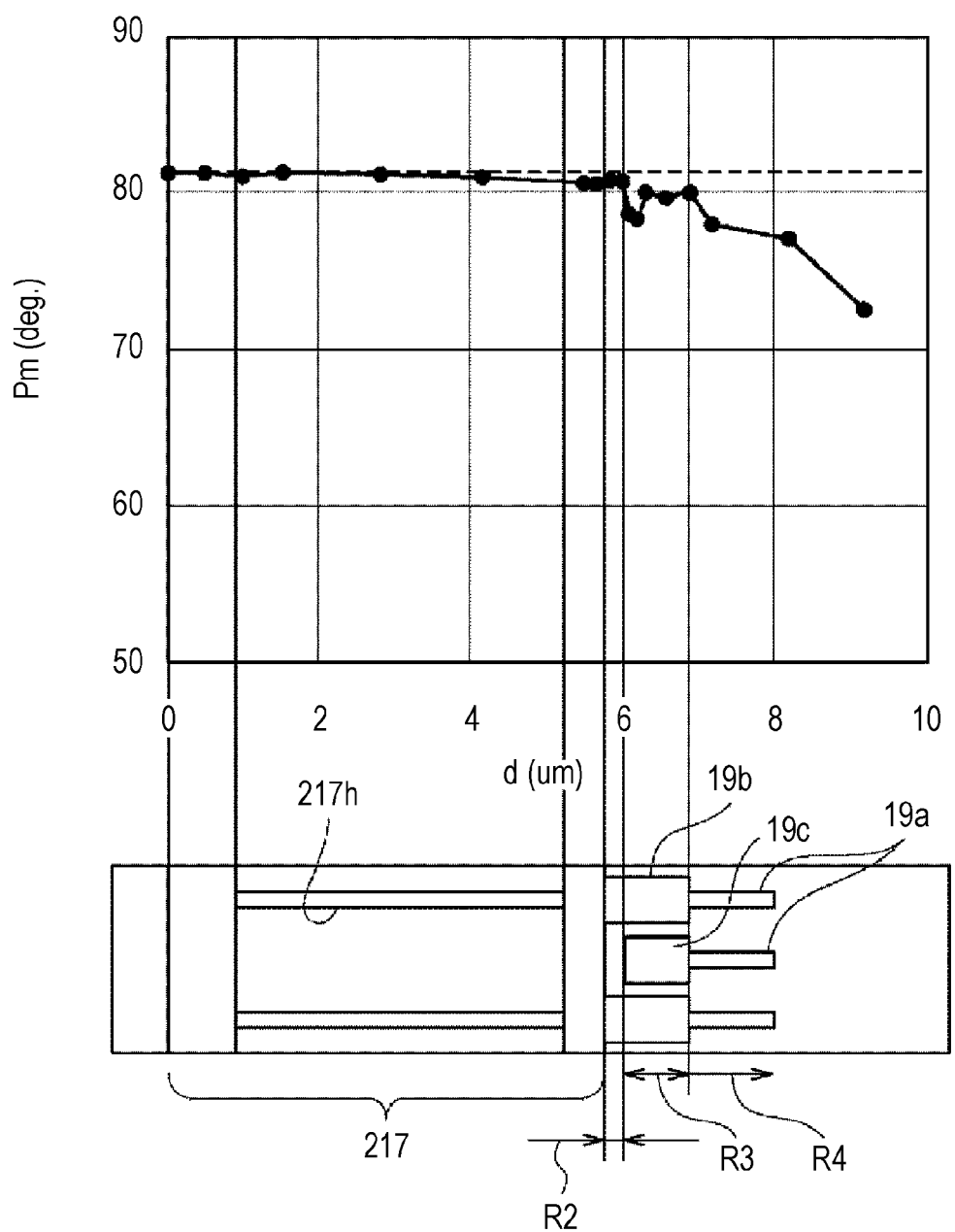
FIG. 16B illustrates other characteristics of the resonator in FIG. 16A.

FIGS. 16A and 16B illustrate characteristics of a resonator according to a second embodiment and are analogous to FIGS. 7A and 7B, respectively.

As illustrated in lower zones of FIGS. 16A and 16B, a busbar 217 in an illustrated example includes a plurality of openings 217h (only one of which is illustrated) arrayed in the propagation direction of the acoustic wave (namely, in an up-down direction on the drawing sheet). The dummy electrodes 21 (in other words, the dummy regions R1) are not disposed. Each of the electrode fingers 19 includes not only the wider portion 19b on the base side, but also a wider portion 19c on the tip side. As illustrated in upper zones of FIGS. 16A and 16B, it was confirmed that, for the index T and the phase average value Pm, tendencies substantially the same as and/or similar to those in the first embodiment can also be obtained with the above configuration.

(Branching Filter)

FIG. 17 is a schematic circuit diagram illustrating a configuration of a branching filter 101 (e.g., a duplexer) as an example of use of the element 1. As understood from reference signs denoted in an upper left zone on the drawing sheet, the comb-shaped electrodes 15 are each schematically illustrated in a two-pronged fork shape, and the reflectors 13 are each represented by one line bent at both ends in FIG. 17.

The branching filter 101 includes, for example, a transmitting filter 109 for carrying out filtering on a transmission signal from a transmitting terminal 105 and outputting the transmission signal to an antenna terminal 103, and a receiving filter 111 for carrying out filtering on a received signal from the antenna terminal 103 and outputting the received signal to a pair of receiving terminals 107.

The transmitting filter 109 is, for example, a ladder filter in which a plurality of resonators 7 (7S and 7P) is connected in a ladder form. In more detail, the transmitting filter 109 includes a plurality of (or one in some cases) serial resonators 7S connected in series between the transmitting terminal 105 and the antenna terminal 103, and a plurality of (or one in some cases) parallel resonators 7P (parallel arms) connecting a serial line of the serial resonators 7S and a reference potential portion (for which a reference sign is omitted).

The receiving filter 111 includes, for example, the resonator 7 and a multi-mode filter (including a double-mode filter) 113. The multi-mode filter 113 includes the plurality of (three in the illustrated example) IDT electrodes 11 arrayed in the propagation direction of the acoustic wave and the pair of reflectors 13 disposed on both sides of the IDT electrodes 11 in one-to-one correspondence.

The IDT electrodes 11 (and the reflectors 13) of the branching filter 101 may be disposed on one composite substrate 3 or on two or more composite substrates 3 in a distributed fashion. The resonators 7 constituting the transmitting filter 109 may be disposed, for example, on the same composite substrate 3. Similarly, the resonator 7 and the multi-mode filter 113 both constituting the receiving filter 111 may be disposed, for example, on the same composite substrate 3. The transmitting filter 109 and the receiving filter 111 may be disposed, for example, on the same composite substrate 3 or on different composite substrates 3. In another example, the serial resonators 7S may be disposed on one composite substrate 3 while the parallel resonators 7P may be disposed on the other one different composite substrate 3.

FIG. 17 merely illustrates an example of configuration of the branching filter 101. Thus, in another example, the receiving filter 111 may be constituted by a ladder filter like the transmitting filter 109. In still another example, the transmitting filter 109 may include the multi-mode filter 113. The branching filter 101 is not limited to the duplexer and may be, for example, a diplexer or a multiplexer including three or more filters.

In the branching filter 101, the resonator 7 and the multi-mode filter 113 may be each regarded as the element 1. The transmitting filter 109 and the receiving filter 111 may also be each regarded as the element 1. Moreover, the branching filter 101 may be regarded as the element 1.

(Communication Device)

Figure 18:
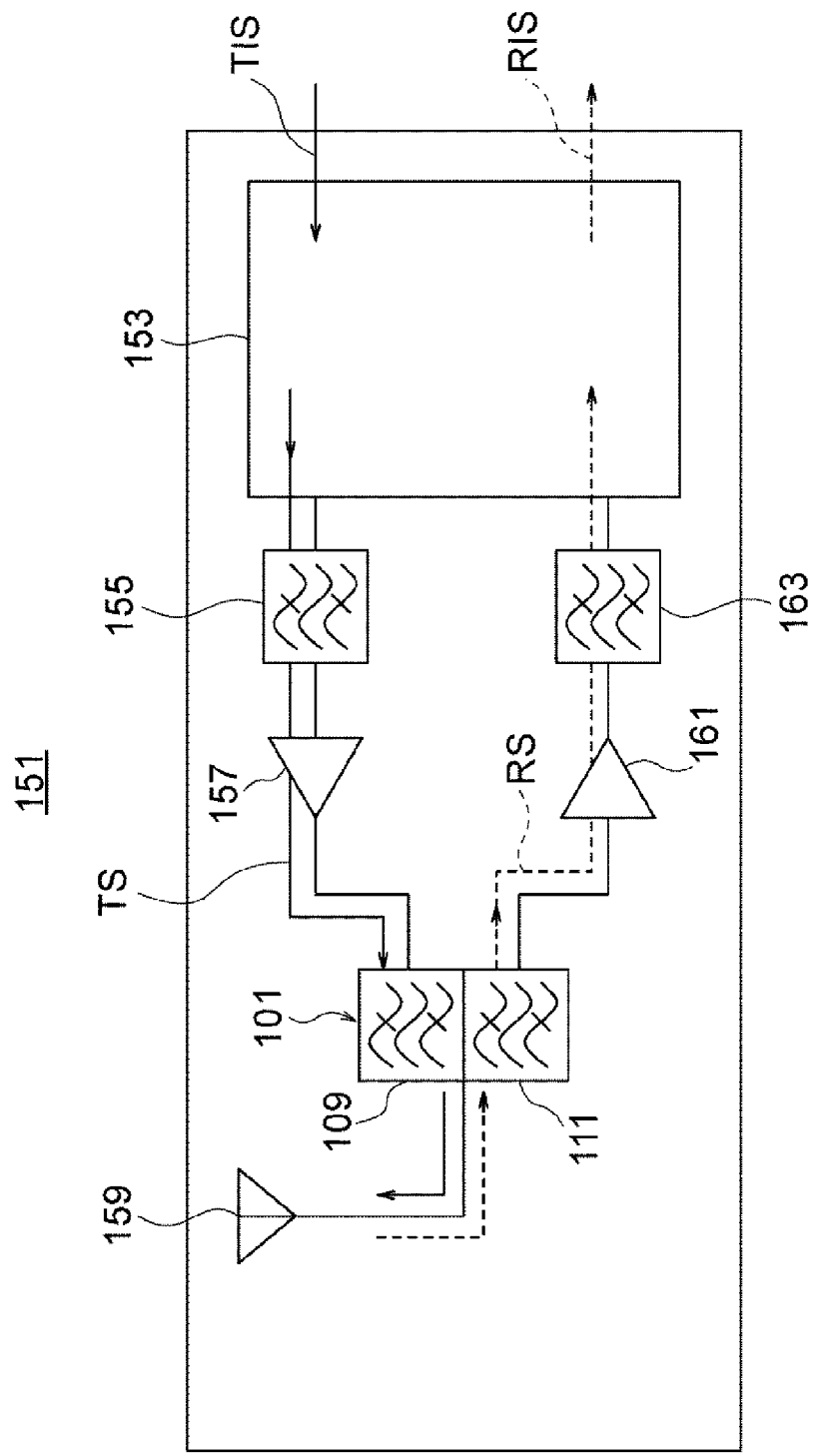
FIG. 18 is a block diagram illustrating a configuration of a communication device according to an embodiment.

FIG. 18 is a block diagram illustrating principal part of a communication device 151 as an example of use of the element 1 (from a different point of view, the branching filter 101). The communication device 151 performs wireless communication utilizing electric waves and includes the branching filter 101.

In the communication device 151, a transmission information signal TIS including information to be transmitted turns to a transmission signal TS through modulation and frequency step-up (conversion to a radio frequency signal of a carrier frequency) by an RF-IC (Radio Frequency Integrated Circuit) 153. After unwanted components outside a transmission passband have been removed by a bandpass filter 155, the transmission signal TS is amplified by an amplifier 157 and is input to the branching filter 101 (via the transmitting terminal 105). The branching filter 101 (the transmitting filter 109) removes the unwanted components outside the transmission passband from the transmission signal TS input thereto and outputs the transmission signal TS after the removal of the unwanted components to an antenna 159 from the antenna terminal 103. The antenna 159 transmits an electric signal (the transmission signal TS) input thereto after conversion to a wireless signal (electric wave).

Furthermore, in the communication device 151, a wireless signal (electric wave) received by the antenna 159 is converted to an electric signal (received signal RS) through the antenna 159 and is input to the branching filter 101 (via the antenna terminal 103). The branching filter 101 (the receiving filter 111) removes unwanted components outside a receive passband from the received signal RS input thereto and then outputs the received signal RS to an amplifier 161 from the receiving terminals 107. The output received signal RS is amplified by the amplifier 161, and the unwanted components outside the receive passband is removed by a bandpass filter 163. Then, the received signal RS turns to a received information signal RIS through frequency step-down and demodulation by the RF-IC 153.

Each of the transmission information signal TIS and the received information signal RIS may be a low-frequency signal (baseband signal) including appropriate information and is, for example, an analog audio signal or a digitized audio signal. The passband of the wireless signal may be set as appropriate and may be in conformity with any suitable one of the known various standards. A modulation method may be any suitable one of a phase modulation, an amplitude modulation, a frequency modulation, and a combination of two or more among those modulations. A circuit system is illustrated, by way of example, as a direct conversion system, but it may be any suitable one other than the direct conversion system. For example, a double superheterodyne system may also be used. FIG. 18 schematically illustrates only the principal part, and a lowpass filter, an isolator, or the like may be added to an appropriate position. Positions of the amplifiers and so on may also be altered.

In the above-described embodiments, the busbar 17A and the busbar 217 are each an example of the first busbar. The busbar 17B and the busbar 217 are each an example of the second busbar. The electrode fingers 19A are an example of the first electrode fingers. The electrode fingers 19B are an example of the second electrode fingers. The end region R3 on the side closer to the busbar 17A is an example of the first end region. The end region R3 on the side closer to the busbar 17B is an example of the second end region. The main portion 19a is an example of the first portion. The wider portion 19b and the wider portion 19c are each an example of the second portion. The dummy electrode 21A is an example of the first dummy electrode. The dummy electrode 21B is an example of the second dummy electrode. The RF-IC 153 is an example of an integrated circuit element.

The technique according to the present disclosure is not limited to the above-described embodiments and may be implemented in various forms.

For instance, the method of increasing, in the second portion, the mass of each electrode finger above the lower surface thereof per unit length in the second direction (direction in which the electrode finger extends) is not limited to the method of forming the second portion as the wider portion. In an example, the thickness of the second portion may be set to be greater than that of the first portion, or an insulating or conductive additional film may be formed only on the second portion between the first portion and the second portion. Alternatively, in the protective film covering the piezoelectric layer 31 from above the conductive layer 5, the thickness of a region of the protective film, the region lying above the second portion, may be set to be greater than that of a region of the protective film, the region lying above the first portion. Two or more among the above-mentioned methods may be combined with each other. As understood from the above description, the mass of the first electrode finger above the lower surface thereof may include not only the mass of the electrode finger itself, but also the mass of another member lying above the electrode finger.

In the embodiments, the wider portion is disposed in each of the first electrode finger and the second electrode finger. Moreover, both the edge of the cavity on the side closer to the first busbar and the edge of the cavity on the side closer to the second busbar overlap the IDT electrode. However, the wider portion may be disposed on only one of the first electrode finger and the second electrode finger, and/or only one of the cavity edge on the side closer to the first busbar and the cavity edge on the side closer to the second busbar may overlap the IDT electrode. The position range of the cavity edge discussed above with reference to FIGS. 7A to 16B may be combined with finger electrodes having other shapes different from those illustrated in the drawings.

REFERENCE SIGNS

1 . . . acoustic wave element,
3 . . . composite substrate
5 . . . conductive layer
11 . . . IDT electrode
17A . . . busbar (first busbar)
17B . . . busbar (second busbar)
19A . . . electrode finger (first electrode finger)
19B . . . electrode finger (second electrode finger)
19a . . . main portion (first portion)
19b . . . wider portion (second portion)
29 . . . support
31 . . . piezoelectric layer
33 . . . cavity
33a . . . edge (of cavity)
R4 . . . central region
R5 . . . end region (first end region or second end region
R6 . . . intersection region.

The invention claimed is:
1. An acoustic wave element comprising:
a support;
a piezoelectric layer on the support; and
an Interdigital Transducer (IDT) electrode on the piezoelectric layer, wherein a cavity overlapping the IDT electrode in a see-through plan view is formed between the piezoelectric layer and the support,
wherein the IDT electrode comprises:
a first busbar and a second busbar opposite to each other in a direction intersecting a first direction;
a plurality of first electrode fingers extending from the first busbar toward the second busbar in parallel; and
a plurality of second electrode fingers extending from the second busbar toward the first busbar in parallel, wherein the plurality of first electrode fingers and the plurality of second electrode fingers are arrayed alternately in the first direction,
wherein an intersection region extending along an array of the plurality of first electrode fingers and the plurality of second electrode fingers in an intersection width over which the first electrode finger and the second electrode finger adjacent to each other overlap when viewing both the electrode fingers in the first direction comprises:
a central region including a center position between the first busbar and the second busbar;
a first end region spanning from an edge of the central region on a side closer to the first busbar to an edge of the intersection region on a side closer to the first busbar; and a second end region spanning from an edge of the central region on a side closer to the second busbar to an edge of the intersection region on a side closer to the second busbar, wherein the cavity overlaps the central region, wherein an edge of the cavity on a side closer to the first busbar is located within a range from the edge of the central region on the side closer to the first busbar to an edge of the first busbar on a side opposite to the central region, wherein the plurality of first electrode fingers each comprises:

a first portion located in the central region; and a second portion located on a side closer to the first busbar or a side closer to the second busbar relative to the central region, and wherein a value of mass per unit length of the plurality of first electrode fingers above lower surfaces thereof in a second direction orthogonal to the first direction is greater in the second portions than in the first portions.

2. The acoustic wave element according to claim 1, wherein a width of the second portion is greater than a width of the first portion.

3. The acoustic wave element according to claim 1, wherein the second portion is located on the side closer to the first busbar relative to the central region.

4. The acoustic wave element according to claim 3, wherein the second portion extends over a range from the first busbar to the edge of the central region on the side closer to the first busbar.

5. The acoustic wave element according to claim 4, wherein the edge of the cavity on the side closer to the first busbar is located within a range from the edge of the intersection region on the side closer to the first busbar to the edge of the first busbar on the side opposite to the central region.

6. The acoustic wave element according to claim 5, wherein the IDT electrode comprises:

a plurality of first dummy electrodes protruding from the first busbar toward the second busbar between adjacent twos of the plurality of first electrode fingers, tip ends of the plurality of first dummy electrodes being arranged to face tip ends of the plurality of second electrode fingers in one-to-one correspondence; and a plurality of second dummy electrodes protruding from the second busbar toward the first busbar between adjacent twos of the plurality of second electrode fingers, tip ends of the plurality of second dummy electrodes being arranged to face tip ends of the plurality of first electrode fingers in one-to-one correspondence;

wherein the edge of the cavity on the side closer to the first busbar is located within a range from the tip ends of the plurality of first dummy electrodes to the edge of the first busbar on the side opposite to the central region.

7. The acoustic wave element according to claim 4, wherein the edge of the cavity on the side closer to the first busbar is located within a range from the edge of the central region on the side closer to the first busbar to an edge of the first busbar on a side closer to the central region.

8. The acoustic wave element according to claim 1, wherein a material, cut angles, and a thickness of the piezoelectric layer satisfy a relationship with which an amplitude of a Lamb wave in an A1 mode among acoustic waves excited by the IDT electrode is maximized.

9. The acoustic wave element according to claim 1, wherein a material of the support is silicon, sapphire, or an aluminum-oxide sintered body.

10. The acoustic wave element according to claim 1, wherein the support includes a layer forming an upper surface of the support and providing an acoustic velocity of 7000 m/s or higher.

11. A communication device comprising:

a filter including the acoustic wave element according to claim 1;

an antenna connected to the filter; and an integrated circuit element connected to the antenna through the filter.

\* \* \* \* \*